(12) United States Patent
Fang et al.

(10) Patent No.: US 8,420,463 B2
(45) Date of Patent: Apr. 16, 2013

(54) METHOD FOR MANUFACTURING PIXEL STRUCTURE

(75) Inventors: Kuo-Lung Fang, Hsin-Chu (TW); Hsiang-Lin Lin, Hsin-Chu (TW); Chin-Yueh Liao, Hsin-Chu (TW)

(73) Assignee: Au Optronics Corporation, Hsinchu (TW)

( * ) Notice: Subject to any disclaimer, the term of this patent is extended or adjusted under 35 U.S.C. 154(b) by 38 days.

(21) Appl. No.: 13/163,774

(22) Filed: Jun. 20, 2011

(65) Prior Publication Data

US 2011/0244615 A1 Oct. 6, 2011

Related U.S. Application Data

(63) Continuation of application No. 12/081,515, filed on Apr. 17, 2008, now abandoned.

(30) Foreign Application Priority Data

Jan. 25, 2008 (TW) .............................. 97103007 A

(51) Int. Cl.
*H01L 21/00* (2006.01)
*H01L 21/84* (2006.01)
*H01L 27/118* (2006.01)
*H01L 23/52* (2006.01)

(52) U.S. Cl.
USPC ............................ 438/151; 257/210; 257/202

(58) Field of Classification Search .................. 257/202, 257/210
See application file for complete search history.

(56) References Cited

U.S. PATENT DOCUMENTS

| 6,255,130 B1 | 7/2001 | Kim |
| 6,287,899 B1 | 9/2001 | Park et al. |
| 6,335,276 B1 | 1/2002 | Park et al. |
| 6,670,104 B2 | 12/2003 | Kido |
| 2005/0073619 A1 | 4/2005 | Chen et al. |
| 2005/0136574 A1 | 6/2005 | Shih |
| 2007/0222936 A1 | 9/2007 | Shih |

FOREIGN PATENT DOCUMENTS

| JP | 2000-164584 | 6/2000 |
| JP | 2000-206571 | 7/2000 |
| JP | 2005-277428 | 10/2005 |
| TW | 437097 | 5/2001 |
| TW | 573162 | 1/2004 |

OTHER PUBLICATIONS

"Office Action of Taiwan Counterpart Application", issued on Feb. 15, 2012, p. 1-p. 7, in which the listed references were cited.

*Primary Examiner* — Fernando L Toledo
*Assistant Examiner* — Valerie N Newton
(74) *Attorney, Agent, or Firm* — Jianq Chyun IP Office

(57) ABSTRACT

A pixel structure includes a scan line, a data line, an active element, a first passivation layer, a second passivation layer and a pixel electrode. The data line includes a first data metal segment and a second data metal layer. The active element includes a gate electrode, an insulating layer, a channel layer, a source and a drain. The channel layer is positioned on the insulating layer above the gate electrode. The source and the drain are positioned on the channel layer. The source is coupled to the data line. The first passivation layer and the second passivation layer cover the active element and form a first contact hole to expose a part of the drain. The second passivation layer covers a part edge of the drain. The pixel electrode is disposed across the second passivation layer and coupled to the drain via the first contact hole.

33 Claims, 48 Drawing Sheets

METHOD FOR MANUFACTURING PIXEL STRUCTURE

CROSS-REFERENCE TO RELATED APPLICATION

This application is a continuation application of and claims the priority benefit of U.S. patent application Ser. No. 12/081,515, filed Apr. 17, 2008, now pending, which claims the priority benefit of Taiwan application Serial No. 97103007, filed Jan. 25, 2008. The entirety of each of the above-mentioned patent applications is hereby incorporated by reference herein and made a part of this specification.

BACKGROUND OF THE INVENTION

1. Field of the Invention

The invention relates in general to a pixel structure and a method for manufacturing the same, and more particularly to a pixel structure having multi-metal signal lines and a method for manufacturing the same.

2. Description of the Related Art

In most of the traditional flat display device technology, several thin film transistors are cooperated with a pixel array formed by several signal lines. The thin film transistors of each pixel in the pixel array are controlled by control signals from the signal lines to selectively receive data according to the pulse of the control signals.

However, as the size of the flat display device increases, the resistance values of the signal lines increase accordingly. In addition, due to the increase of the overlapping area of the signal lines, the RC delay of the signals occurs more frequently to cause the signal transmission distortion.

Thus, how to decease the resistance values of the signal lines so as to avoid the signal distortion is critical for the quality of the large size flat display device.

SUMMARY OF THE INVENTION

The invention is directed to a pixel structure and a method for manufacturing the same. The pixel structure has double-metal signal lines, so that the transmission resistance values of the signal lines is reduced to provide a flat display device with the stable and precise signal transmission quality. In addition, the number of the mask processes of the method for manufacturing the pixel structure is reduced to remarkably decrease the manufacturing cost.

According to the invention, a pixel structure including a scan line, a data line, an active element, a first passivation layer, a second passivation layer and a pixel electrode is provided. The scan line has a first scan metal layer and a second scan metal layer. The data line is interlaced with the scan line to form an interlacing region. The data line includes a first data metal segment and a second data metal layer. The first data metal segment and the interlacing region are spaced at a first distance. The second data metal layer is disposed on the first data metal segment and across the interlacing region. The active element electrically coupled to the scan line and the data line includes a gate electrode, an insulating layer, a channel layer, a drain and a source. The gate electrode is electrically connected to the scan line. The insulating layer is partially positioned on the gate electrode. The channel layer is positioned on the insulating layer above the gate electrode. The source and the drain are positioned on the channel layer. The source is coupled to the data line. The first passivation layer and the second passivation layer cover the active element and form a first contact hole to expose a part of the drain. The second passivation layer covers a part edge of the drain. The pixel electrode is disposed across the second passivation layer and is coupled to the drain via the first contact hole.

According to the invention, a method for manufacturing a pixel structure includes following steps is provided. First, a substrate is provided. Then, a patterned first metal layer is formed on the substrate. The patterned first metal layer includes a gate electrode, a first scan metal layer and a first data metal segment. After that, a patterned insulating layer is formed on the patterned first metal layer. Then, a patterned semi-conducting layer is formed on the patterned insulating layer. After that, a patterned second metal layer including a source, a drain, a second scan metal layer and a second data metal layer is formed. The source and the drain are formed on the patterned semi-conducting layer and constitute an active element with the gate electrode. The first data metal segment and the second data metal layer constitute a data line electrically connected to the source. The first scan metal layer and the second scan metal layer constitute a scan line electrically connected to the gate electrode. Then, a patterned passivation layer partially covering a part edge of the drain is formed. After that, a patterned transparent conductive layer including a pixel electrode is formed. The pixel electrode is disposed across the patterned passivation layer on the part edge of the drain and electrically connected to the drain.

Other objects, features, and advantages of the invention will become apparent from the following detailed description of the preferred but non-limiting embodiments. The following description is made with reference to the accompanying drawings.

DETAILED DESCRIPTION OF THE INVENTION

First Embodiment

Figure 1:
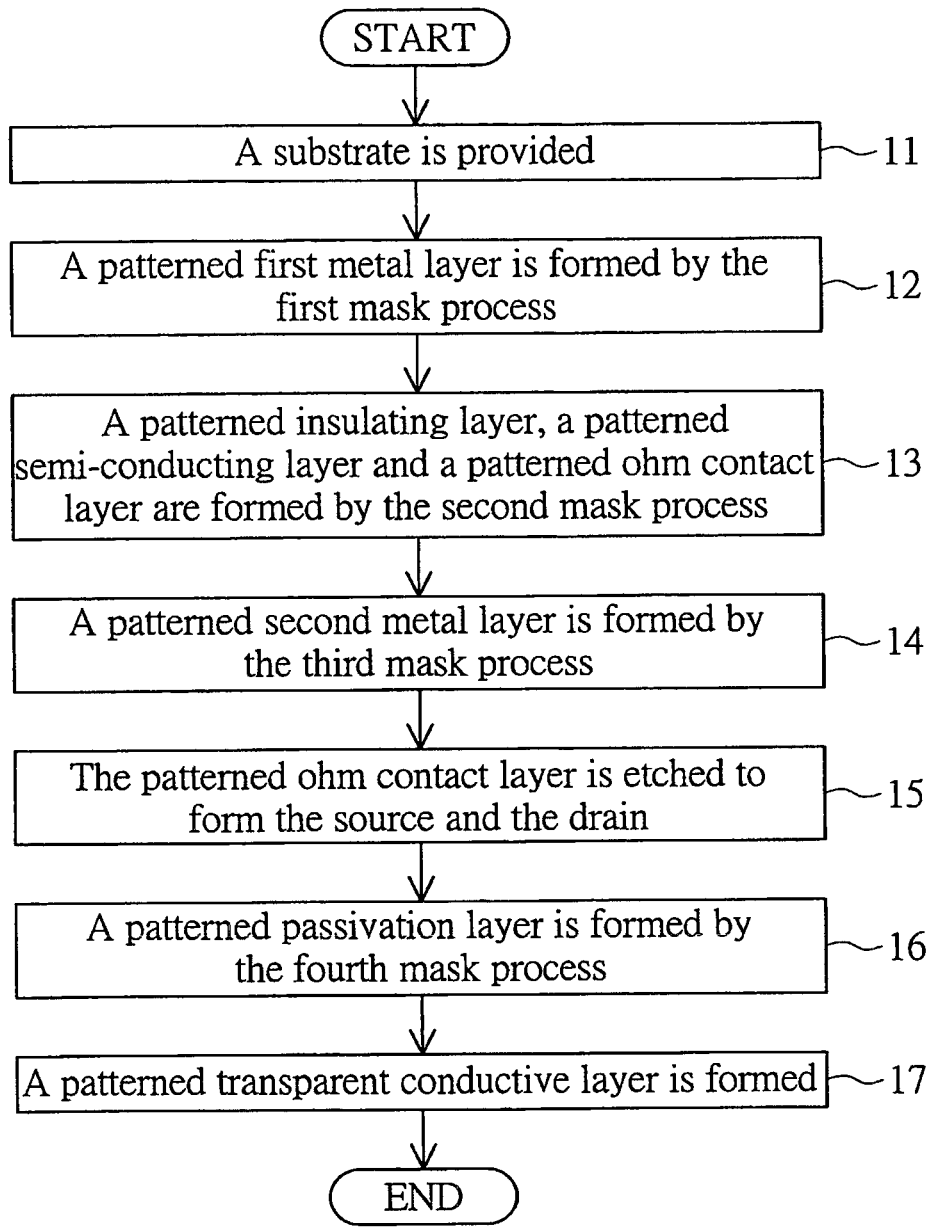
FIG. 1 is a flow chart of a method for manufacturing a pixel structure according to the first embodiment of the invention.
Figure 2A:
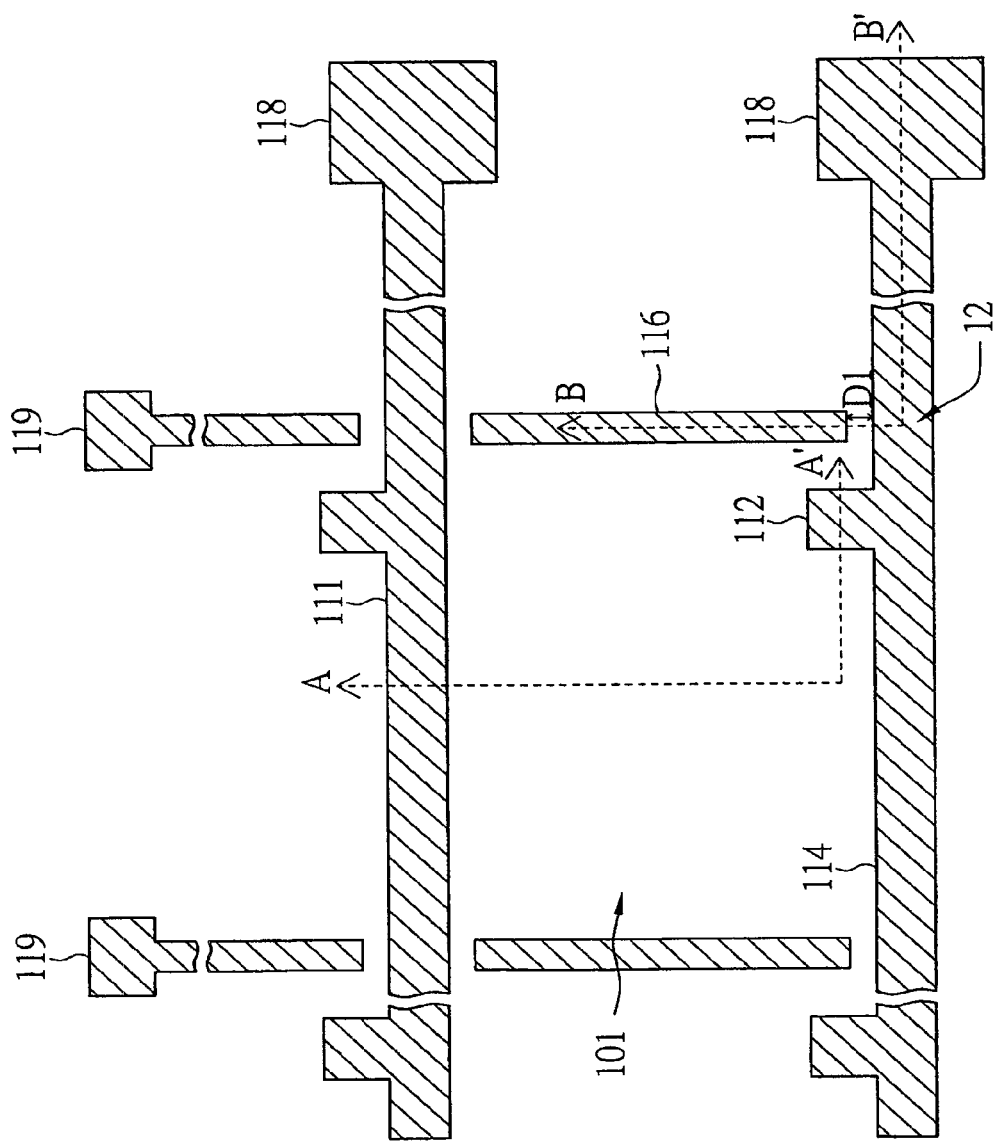
FIG. 2A illustrates the pixel structure of the first embodiment after the first mask process.
Figure 2B:
FIG. 2B is a cross-sectional view taken along line AA' in FIG. 2A.
Figure 2C:
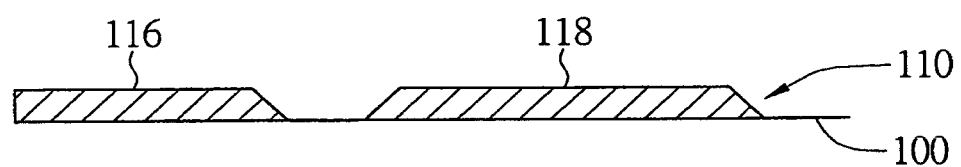
FIG. 2C is a cross-sectional view taken along line BB' in FIG. 2A.

Referring to FIG. 1, a flow chart of a method for manufacturing a pixel structure according to the first embodiment of the invention is illustrated. Referring to FIGS. 2A~2C at the same time, the pixel structure of the first embodiment after the first mask process and cross-sectional views taken along lines AA' and BB' in FIG. 2A are illustrated, respectively.

Please refer to FIG. 2A. First, as shown in the step 11, a substrate 100 is provided. Then, as shown in the step 12, a patterned first metal layer 110 is formed on the substrate 100 by the first mask process. The patterned first metal layer 110 includes a gate electrode 112, a first scan metal layer 114 and a first data metal segment 116. The first scan metal layer 114 and the first data metal segment 116 surround a display area 101 and the first scan metal layer 114 has an interlacing region 12, and the first data metal segment 116 and the interlacing region 12 are spaced at a first distance D1. In addition, as shown in FIG. 2B, the patterned first metal layer 110 further includes a patterned first metal layer 111 disposed on the substrate 100. Besides, as shown in FIG. 2A and FIG. 2C, the patterned first metal layer 110 further includes a scan pad 118 and a data pad 119 disposed on the substrate 100 and electrically connected to the first scan metal layer 114 and the first data metal segment 116, respectively.

Figure 3A:
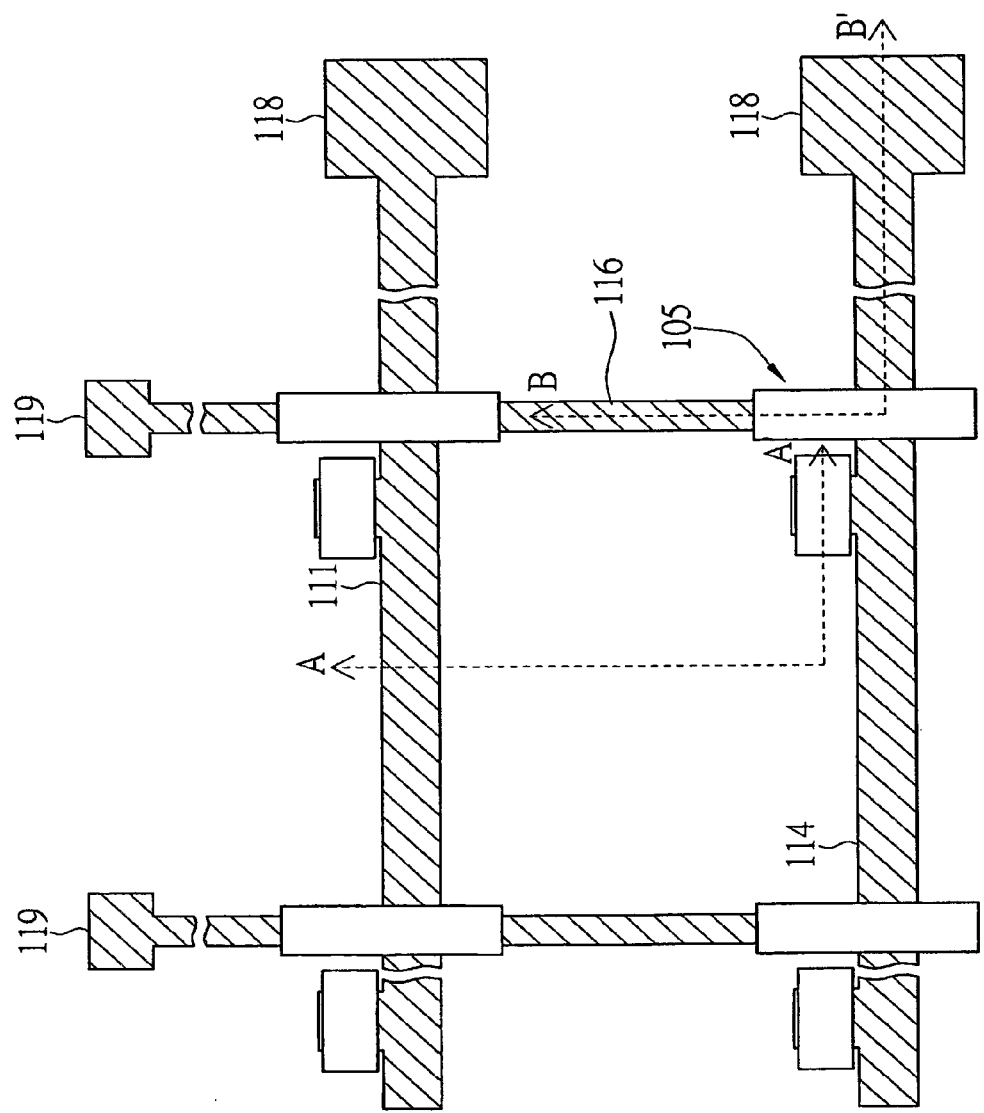
FIG. 3A illustrates the pixel structure of the first embodiment after the second mask process.
Figure 3B:
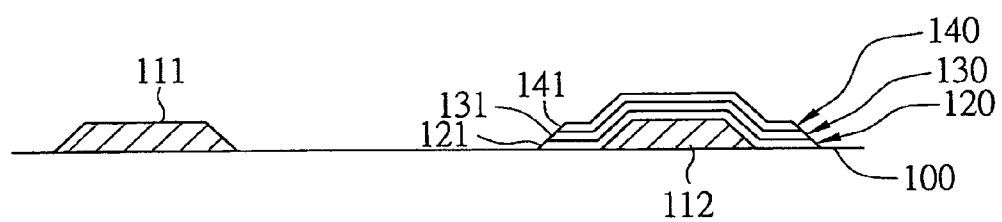
FIG. 3B is a cross-sectional view taken along line AA' in FIG. 3A.
Figure 3C:
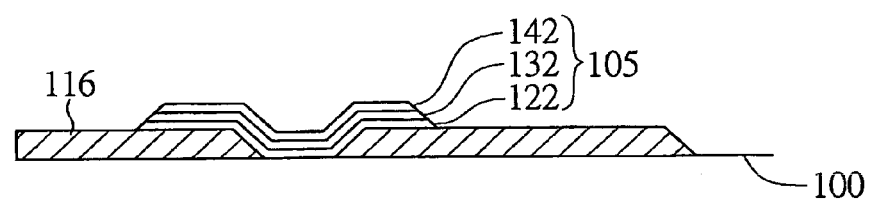
FIG. 3C is a cross-sectional view taken along line BB' in FIG. 3A.

Referring to FIGS. 3A~3C at the same time, the pixel structure of the first embodiment after the second mask process and cross-sectional views taken along lines AA' and BB' in FIG. 3A are illustrated, respectively. After that, as shown in the step 13, a patterned insulating layer 120, a patterned semi-conducting layer 130 and a patterned ohm contact layer 140 are formed by the second mask process. The step 13 can be performed by one photolithography process after an insulating material layer (not illustrated), a semi-conducting material layer (not illustrated) and an ohm contact material layer (not illustrated) are sequentially formed. The detail steps are stated as follows. First, the insulating material layer is deposited on the patterned first metal layer 110. Then, the semi-conducting material layer and the ohm contact material layer are sequentially deposited on the insulating material layer. After that, a patterned photoresist layer (not illustrated) is formed on the ohm contact material layer and the semi-conducting material layer. Then, the ohm contact material layer, the semi-conducting material layer and the insulating material layer are etched to form the patterned ohm contact layer 140, the patterned semi-conducting layer 130 and the patterned insulating layer 120. After that, the patterned photoresist layer is removed. The patterned insulating layer 120 covers the gate electrode 112, a part of the first data metal segment 116 and the first scan metal layer 114.

Besides, as shown in FIG. 3A and FIG. 3C, a patterned insulating layer 122, a patterned semi-conducting layer 132, a patterned ohm contact layer 142 are formed as a separating layer 105 disposed across the first scan metal layer 114 in the interlacing region 12.

Figure 4A:
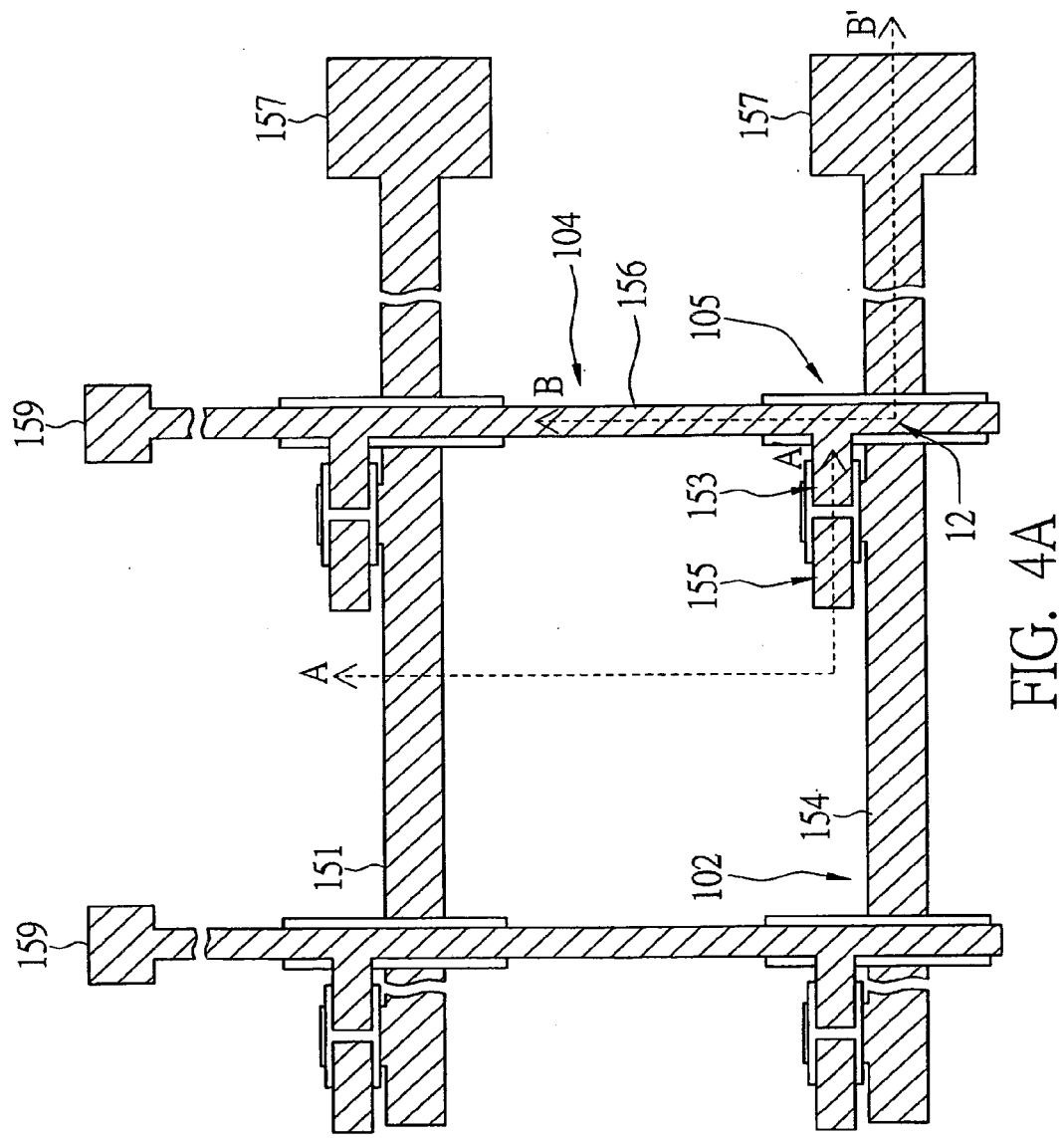
FIG. 4A illustrates the pixel structure of the first embodiment after the third mask process.
Figure 4B:
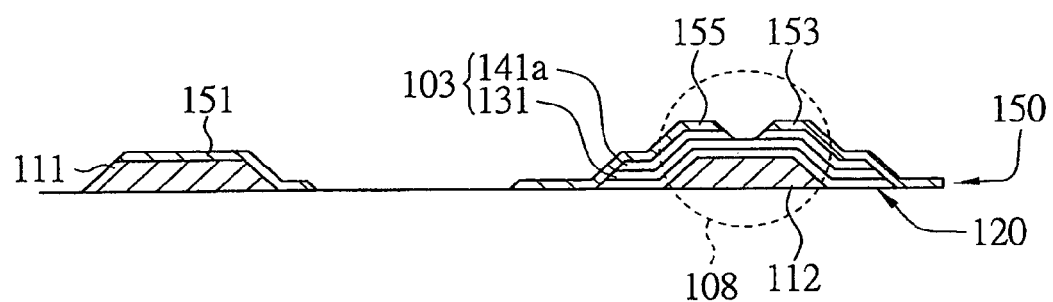
FIG. 4B is a cross-sectional view taken along line AA' in FIG. 4A.
Figure 4C:
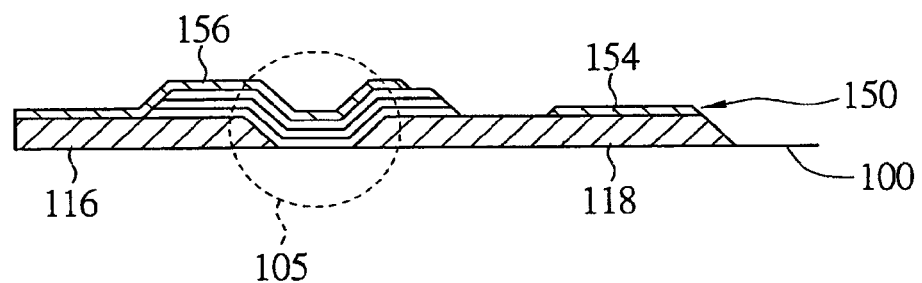
FIG. 4C is a cross-sectional view taken along line BB' in FIG. 4A.

Referring to FIGS. 4A~4C at the same time, the pixel structure of the first embodiment after the third mask process and cross-sectional views taken along lines AA' and BB' in FIG. 4A are illustrated, respectively. Then, as shown in the step 14, a patterned second metal layer 150 is formed by the third mask process. The patterned second metal layer 150 includes a source 153, a drain 155, a second scan metal layer 154 and a second data metal layer 156. The first data metal segment 116 and the second data metal layer 156 constitute a data line 104 electrically connected to the source 153. The first scan metal layer 114 and the second scan metal layer 154 constitute a scan line 102 electrically connected to the gate electrode 112. Furthermore, the scan line 102 and the data line 104 are interlaced with each other in the interlacing region 12.

As shown in FIGS. 4A~4C, the data line 104 and the source 153 are coupled to each other. The data line 104 includes the first data metal segment 116 and the second data metal layer 156. The second data metal layer 156 is disposed on the first data metal segment 116 and across the interlacing region 12.

In addition, as shown in FIG. 4A and FIG. 4C, the data line 104 further includes the separating layer 105 disposed across the scan line 102. The second data metal layer 156 is disposed on the separating layer 105. Therefore, the data line 104 is electrically isolated from the scan line 102 through the separating layer 105 so as to avoid a short circuit occurring.

Besides, a patterned second metal layer 151 is formed on the patterned first metal layer 111, and patterned second metal layers 157, 159 are formed simultaneously in the step 14 to couple to the scan pad 118 and the data pad 119, respectively.

After that, as shown in the step 15, the patterned ohm contact layer 141 is etched to form a patterned ohm contact layer 141a. The source 153 and the drain 155 are formed on a patterned semi-conducting layer 131 and the patterned ohm contact layer 141a and constitute an active element 108, such as a thin film transistor, with the gate electrode 112. The patterned semi-conducting layer 131 and the patterned ohm contact layer 141a constitute a channel layer 103 positioned on the patterned insulating layer 120 above the gate electrode 112, as shown in FIG. 4B.

Figure 5A:
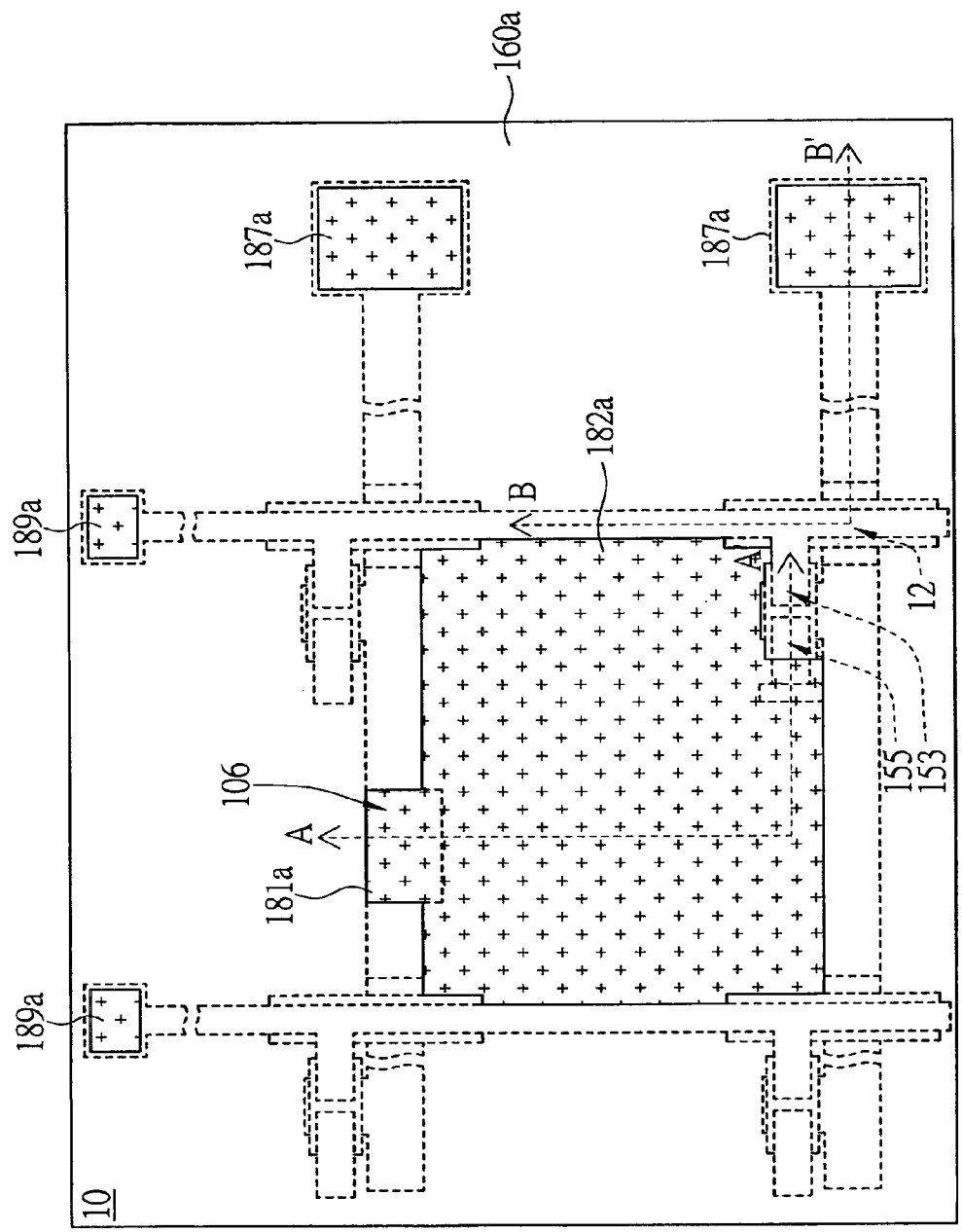
FIG. 5A illustrates the pixel structure of the first embodiment after the fourth mask process.
Figure 5B:
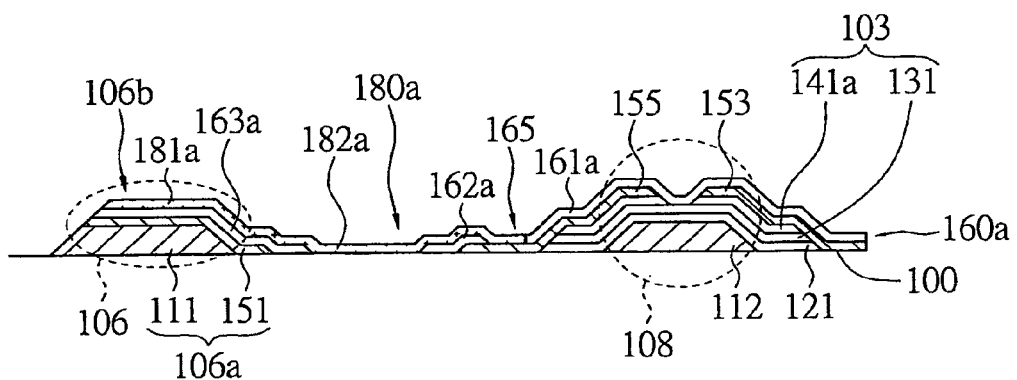
FIG. 5B is a cross-sectional view taken along line AA' in FIG. 5A.
Figure 5C:
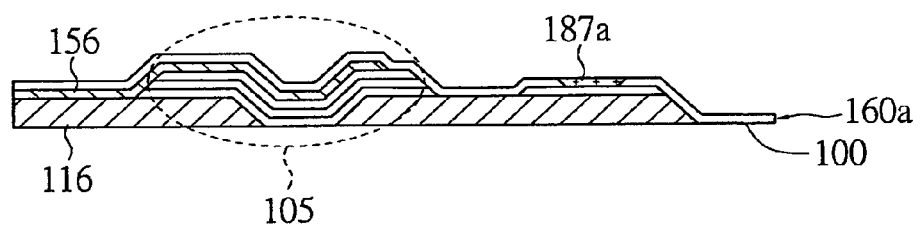
FIG. 5C is a cross-sectional view taken along line BB' in FIG. 5A.

Referring to FIGS. 5A~5C at the same time, the pixel structure of the first embodiment after the fourth mask process and cross-sectional views taken along lines AA' and BB' in FIG. 5A are illustrated, respectively. Then, as shown in the step 16, a patterned passivation layer 160a covering a part edge of the drain 155 is formed by the fourth mask process.

After that, as shown in the step 17, a patterned transparent conductive layer 180a is formed. The patterned transparent conductive layer 180a includes a pixel electrode 182a. Besides, patterned transparent conductive layers 187a, 189a of the patterned transparent conductive layer 180a are coupled to the patterned second metal layers 157, 159, respectively.

In the embodiment, the pixel electrode 182a is disposed across the patterned passivation layer 162a on the part edge of the drain 155 to be electrically connected to the drain 155. Therefore, the pixel electrode 182a and the drain 155 have good electrical conduction because of the patterned passivation layer 162a, and the situation for the pixel electrode 182a to break during the formation can also be avoided. Preferably, the material of the patterned transparent conductive layer 180a is, for example, indium oxide (ITO).

Figure 5D:
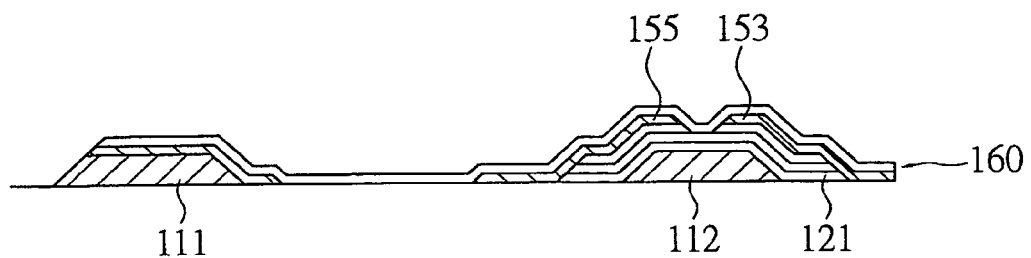
FIGS. 5D~5I illustrate the detail steps of the fourth mask process of the first embodiment.

The steps 16~17 are elaborated in FIGS. 5D~5I. Referring to FIGS. 5D~5I, the detail steps of the fourth mask process of the first embodiment are illustrated. As shown in FIG. 5D, a passivation material layer 160 is firstly formed.

Figure 5E:
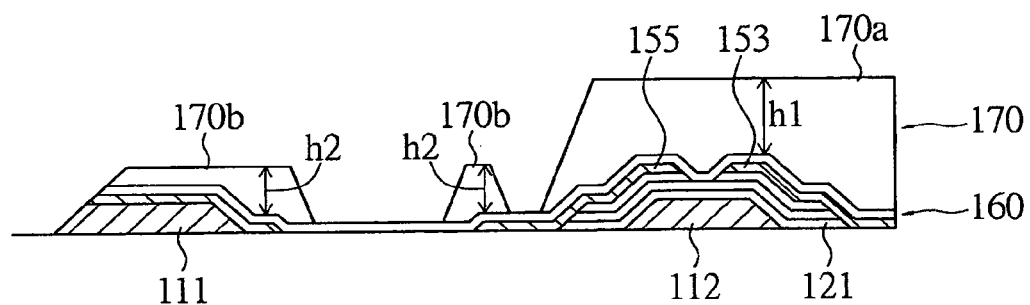

Then, as shown in FIG. 5E, a patterned photoresist layer 170 is formed on the passivation material layer 160. The patterned photoresist layer 170 includes a patterned photoresist layer 170a with the thickness h1 and a patterned photoresist layer 170b with the thickness h2. The thickness h1 is greater than the thickness h2. The step of forming the patterned photoresist layer 170a can be performed by using a halftone mask or a gray-tone mask.

Figure 5F:
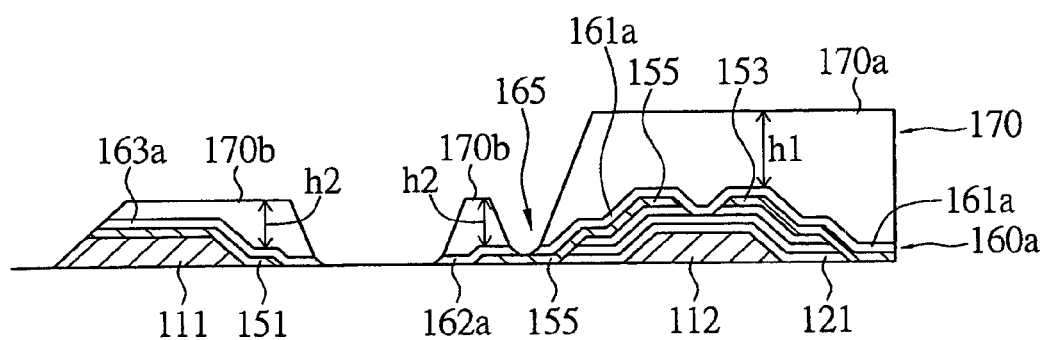

After that, as shown in FIG. 5F, the passivation material layer 160 is etched to form the patterned passivation layer 160a. The patterned passivation layer 160a includes a first passivation layer 161a and the second passivation layer 162a. The first passivation layer 161a and the second passivation layer 162a form a contact hole 165 to expose the drain 155. The second passivation layer 162a covers the part edge of the drain 155.

Besides, the patterned passivation layer 160a includes a third passivation layer 163a covering the patterned second metal layer 151.

Figure 5G:
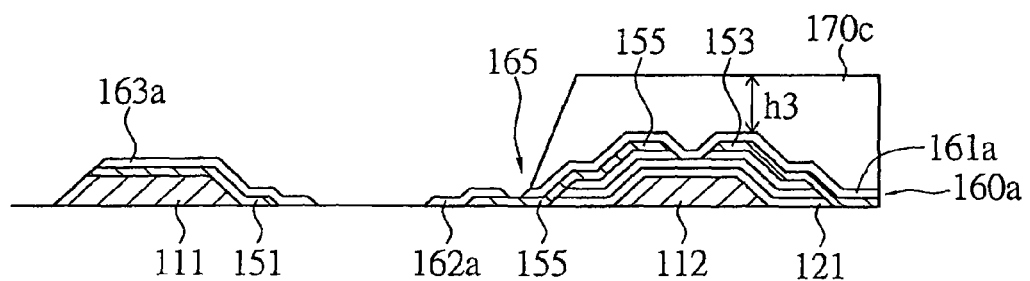

Then, as shown in FIG. 5G, the patterned photoresist layer 170 is ashed to expose the second passivation layer 162a. After the patterned photoresist layer 170 is ashed, the patterned photoresist layer 170b is removed and the original patterned photoresist layer 170a becomes a patterned photoresist layer 170c with the thickness h3.

Figure 5H:
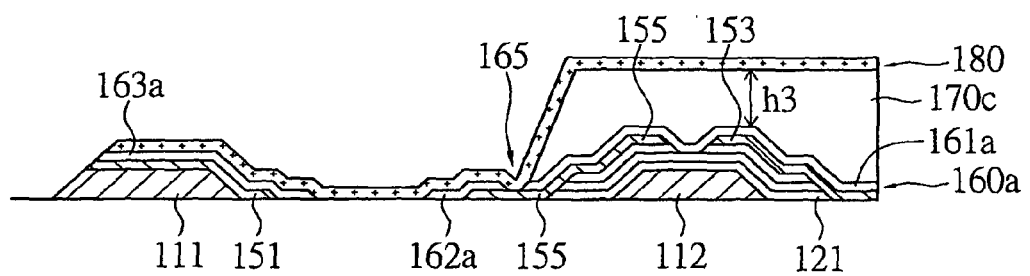

After that, as shown in FIG. 5H, a transparent conductive layer 180 is formed. The transparent conductive layer 180 is coupled to the drain 155 via the contact hole 165.

Figure 5I:
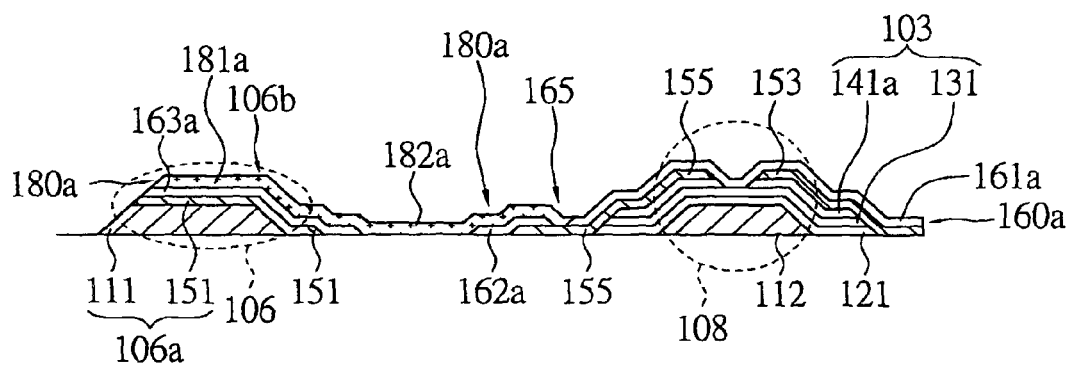

Then, as shown in FIG. 5I, the remaining patterned photoresist layer 170c is removed and part of the transparent conductive layer 180 on the remaining patterned photoresist layer 170c is also removed so as to form the patterned transparent conductive layer 180a. The transparent conductive layer 180a includes the pixel electrode 182a and a patterned transparent conductive layer 181a covering the patterned second metal layer 151. Heretofore, the pixel structure 10 is completed. The step of removing the remaining patterned photoresist layer 170c includes the lift-off process. Preferably, the patterned photoresist layer 170c is removed by using chemicals or performing the laser lift-off process.

As shown in FIG. 5A and FIG. 5B, the pixel structure 10 includes the active element 108, the first passivation layer 161a, the second passivation layer 162a, the storage capacitor 106 and the pixel electrode 182a. The active element 108 is closely adjacent to the interlacing region 12 and electrically coupled to the scan line 102 and the data line 104. The active element 108 includes the gate electrode 112, the patterned insulating layer 121, the channel layer 103, the source 153 and the drain 155. The gate electrode 112 and the scan line 102 are electrically connected to each other. The patterned insulating layer 121 is positioned on the gate electrode 112. The channel layer 103 is positioned on the patterned insulating layer 121 above the gate electrode 112. The source 153 and the drain 155 are positioned on the channel layer 103, and the source 153 is coupled to the data line 104. The channel layer 103 includes the patterned ohm contact layer 141a and the patterned semi-conducting layer 131. The patterned ohm contact layer 141a is disposed on the patterned semi-conducting layer 131.

As shown in FIG. 5B, the first passivation layer 161a and the second passivation layer 162a cover the active element 108 and form the contact hole 165 to expose the part of the drain 155. The second passivation layer 162a covers the part edge of the drain 155.

As shown in FIG. 5B, the storage capacitor 106 has a first capacitance metal layer 106a and a second capacitance metal layer 106b. The second capacitance metal layer 106b is disposed on the first capacitance metal layer 106a. The first capacitance metal layer 106a includes the patterned first metal layer 111 and the patterned second metal layer 151. The second capacitance metal layer 106b includes the patterned transparent conductive layer 181a. The patterned transparent conductive layer 181a connected to the pixel electrode 182a covers the third passivation layer 163a. The third passivation layer 163a disposed between the first capacitance metal layer 106a and the second capacitance metal layer 106b is used as a capacitance insulating layer. Therefore, in the embodiment, the storage capacitor 106 composed of a metal layer, an insulator and a transparent layer (such as ITO) is called MII capacitance structure.

Second Embodiment

The method for manufacturing a pixel structure of the second embodiment differs from that of the first embodiment in using a halftone mask or a gray-tone mask in the second mask process. Therefore, an insulating layer and a semi-conducting layer of the pixel structure of the second embodiment are formed with different patterns, respectively.

Figure 6:
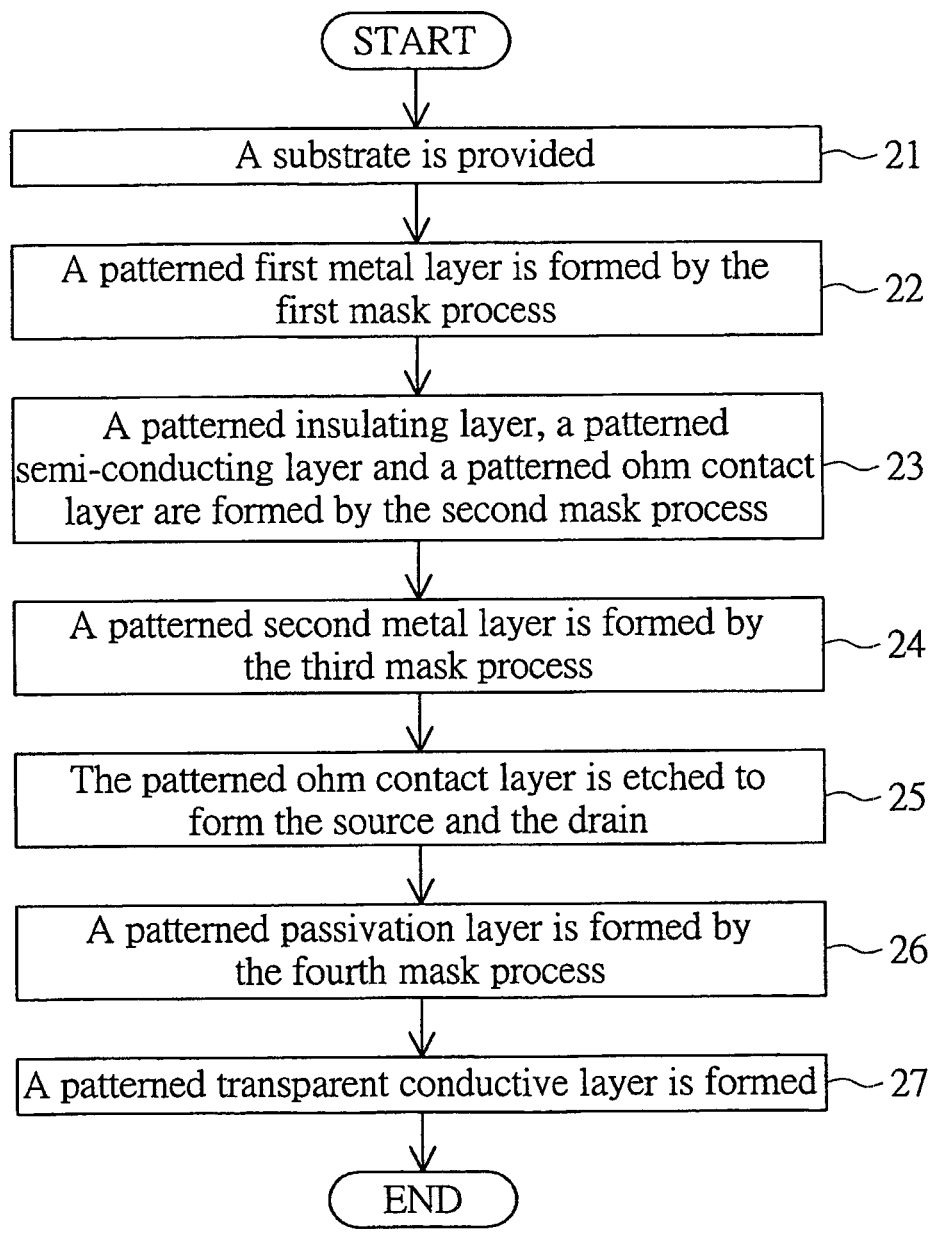
FIG. 6 is a flow chart of a method for manufacturing a pixel structure according to the second embodiment of the invention.
Figure 7A:
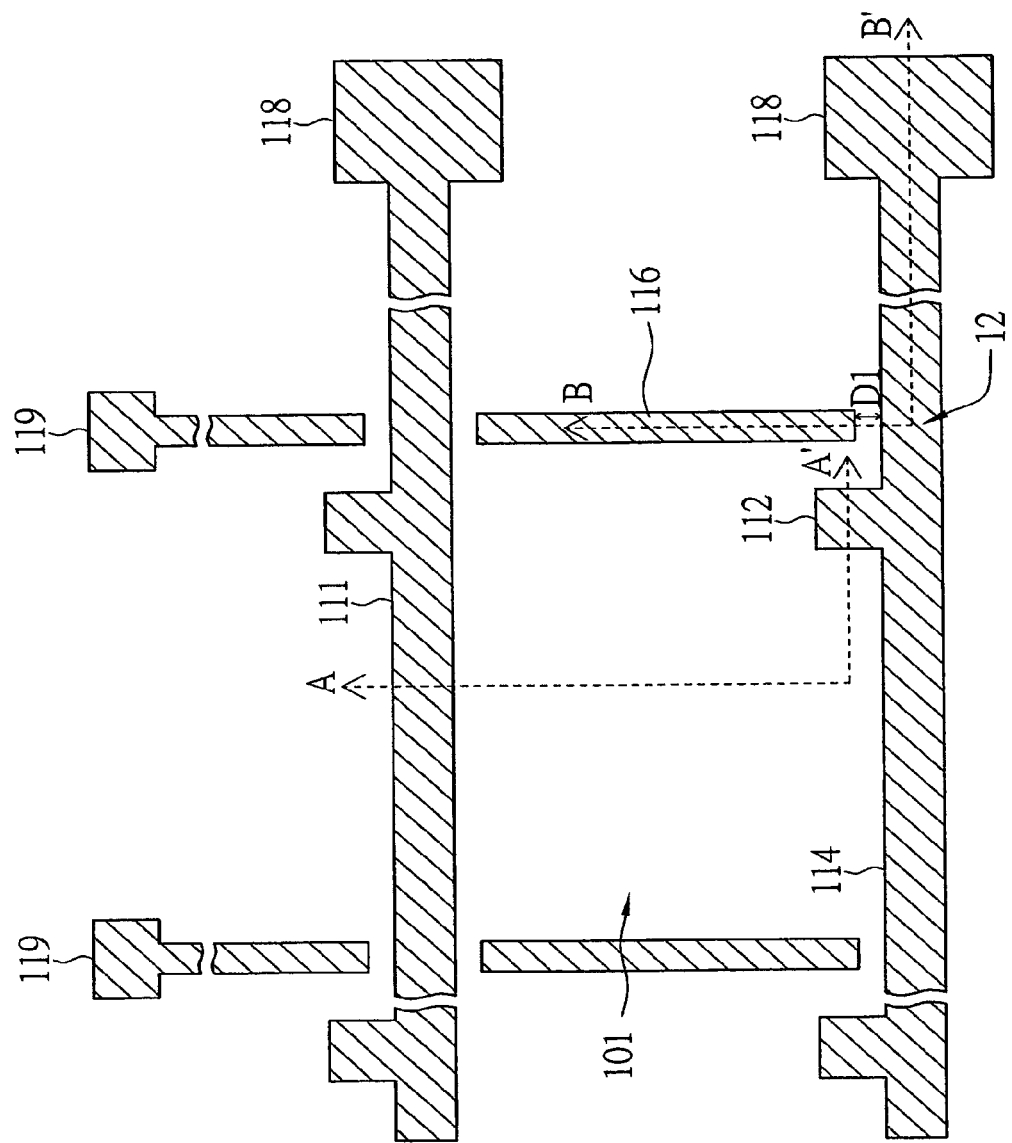
FIG. 7A illustrates the pixel structure of the second embodiment after the first mask process.
Figure 7B:
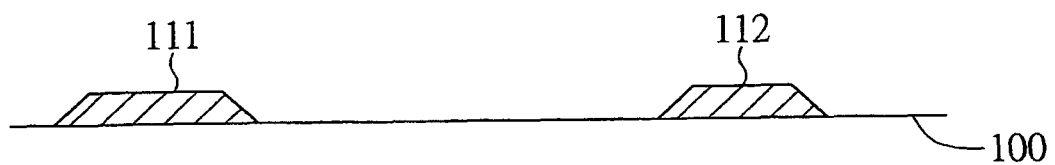
FIG. 7B is a cross-sectional view taken along line AA' in FIG. 7A.
Figure 7C:
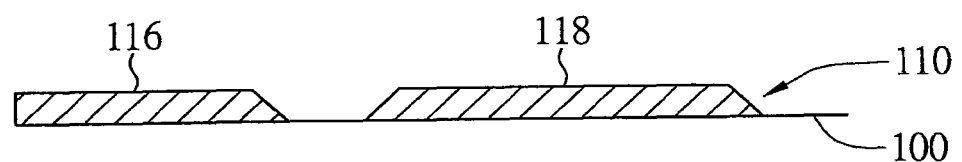
FIG. 7C is a cross-sectional view taken along line BB' in FIG. 7A.

Referring to FIG. 6, a flow chart of a method for manufacturing a pixel structure according to the second embodiment of the invention is illustrated. Referring to FIGS. 7A~7C at the same time, the pixel structure of the second embodiment after the first mask process and cross-sectional views taken along lines AA' and BB' in FIG. 7A are illustrated, respectively.

Please refer to FIG. 7A. First, as shown in the step 21, a substrate 100 is provided. Then, as shown in the step 22, a patterned first metal layer 110 is formed on the substrate 100 by the first mask process. The patterned first metal layer 110 includes a gate electrode 112, a first scan metal layer 114 and a first data metal segment 116. The first scan metal layer 114 and the first data metal segment 116 surround a display area 101 and the first scan metal layer 114 has an interlacing region 12, and the first data metal segment 116 and the interlacing region 12 are spaced at a first distance D1. In addition, as shown in FIG. 7B, the patterned first metal layer 110 further includes a patterned first metal layer 111 disposed on the substrate 100. Besides, as shown in FIG. 7C, the patterned first metal layer 110 further includes a scan pad 118 and a data pad 119 disposed on the substrate 100 and electrically connected to the first scan metal layer 114 and the first data metal segment 116, respectively. Basically, the steps 21, 22 and the steps 11, 12 of the first embodiment are the same, respectively.

Figure 8A:
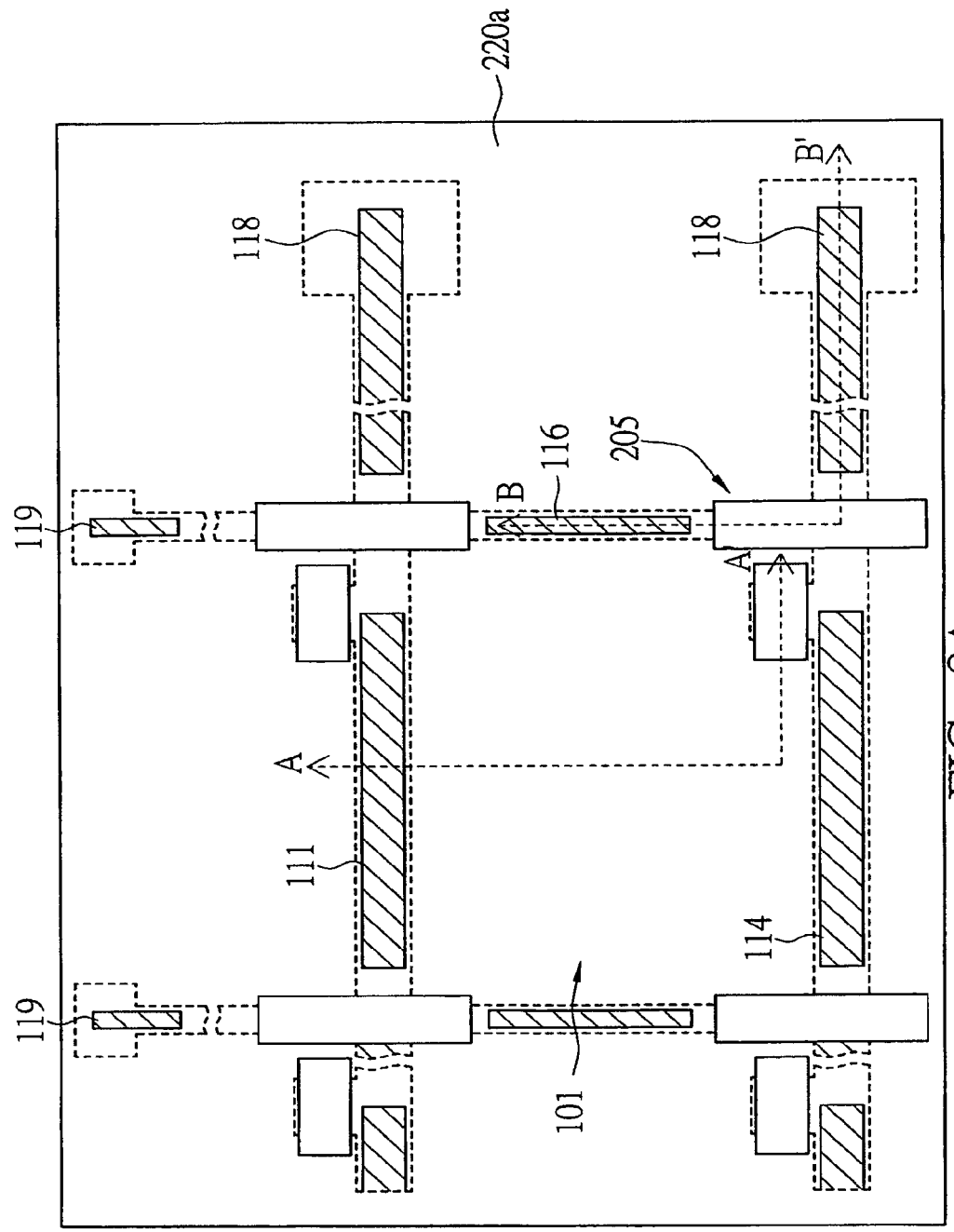
FIG. 8A illustrates the pixel structure of the second embodiment after the second mask process.
Figure 8B:
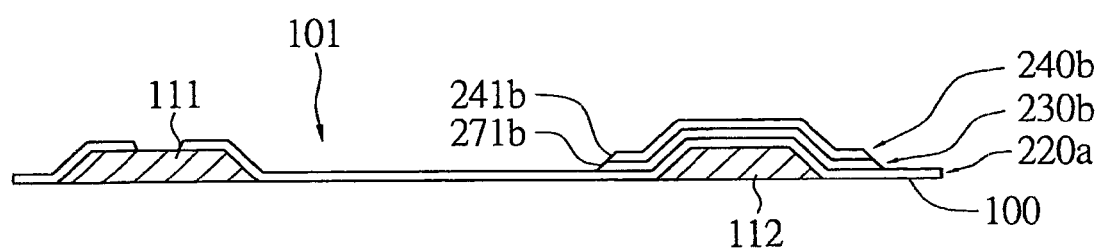
FIG. 8B is a cross-sectional view taken along line AA' in FIG. 8A.
Figure 8C:
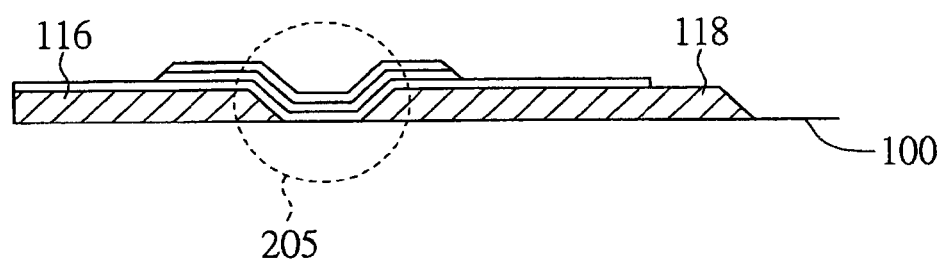
FIG. 8C is a cross-sectional view taken along line BB' in FIG. 8A.

Referring to FIGS. 8A~8C at the same time, the pixel structure of the second embodiment after the second mask process and cross-sectional views taken along lines AA' and BB' in FIG. 8A are illustrated, respectively. Then, as shown in the step 23, a patterned insulating layer 220a, a patterned semi-conducting layer 230b and a patterned ohm contact layer 240b are formed by the second mask process. The step 23 differs from the step 13 of the first embodiment in using a halftone mask or a gray-tone mask to form a patterned photoresist layer with different thicknesses. Therefore, the pattern of the patterned insulating layer 220a is different from the patterns of the patterned semi-conducting layer 230b and the patterned ohm contact layer 240b. Besides, the patterned insulating layer 220 covers the display area 101 and exposes the first scan metal layer 114, the first data metal segment 116, the patterned first metal layer 111, the scan pad 118 and the data pad 119.

In addition, as shown in FIG. 8A, a separating layer 205 disposed across the first scan metal layer 114 in the interlacing region 12 is formed. The separating layer 205 differs from the separating layer 105 of the first embodiment in the patterns. The patterns of the patterned ohm contact layer and the patterned semi-conducting layer in the separating layer 205 are different from the pattern of the patterned insulating layer.

Figure 8D:
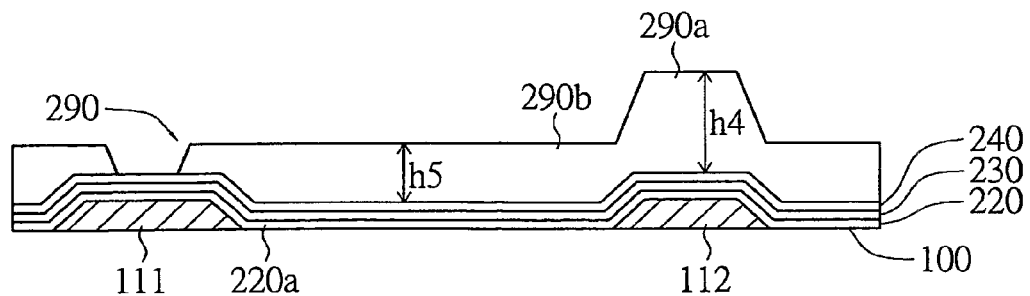
FIGS. 8D~8G illustrate the detail steps of the second mask process of the second embodiment.

The step 23 is elaborated in FIGS. 8D~8G. Referring to FIGS. 8D~8G, the detail steps of the second mask process of the second embodiment are illustrated. As shown in FIG. 8D, an insulating material layer 220, a semi-conducting material layer 230 and an ohm contact material layer 240 are sequentially deposited on the patterned first metal layer 110. Then, a patterned photoresist layer 290 is formed on the semi-conducting material layer 230. The patterned photoresist layer 290 includes a patterned photoresist layer 290a with the thickness h4 and a patterned photoresist layer 290b with the thickness h5. The thickness h4 is greater than the thickness h5.

Figure 8E:
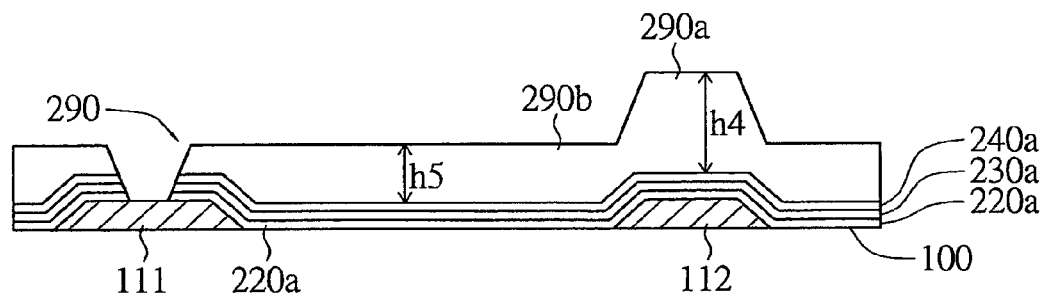

After that, as shown in FIG. 8E, the ohm contact material layer 240, the semi-conducting material layer 230 and the insulating material layer 220 are etched to form the patterned ohm contact layer 240a, the patterned semi-conducting layer 230a and the patterned insulating layer 220a by using the patterned photoresist layer 290 as a mask. The pattered insulating layer 220a exposes the first scan metal layer 114, the first data metal segment 116, the patterned first metal layer 111, the scan pad 118 and the data pad 119, as shown in FIG. 8A.

Figure 8F:
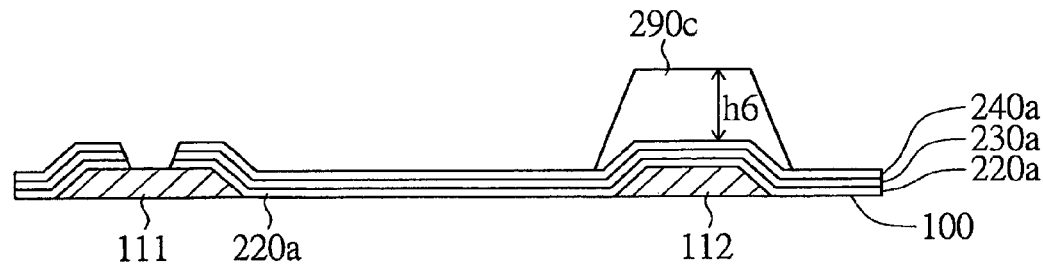

Then, as shown in FIG. 8F, the patterned photoresist layer 290b with the thickness h5 is ashed to expose a part of the patterned ohm contact layer 240a and the patterned semi-conducting layer 230a. The patterned photoresist layer 290a with the thickness h4 is cut off to form a patterned photoresist layer 290c with the thickness h6.

Figure 8G:
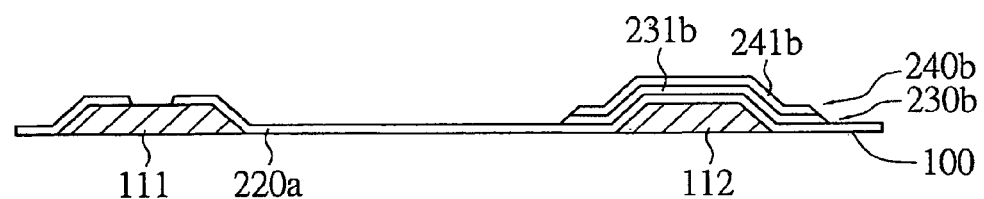

After that, as shown in FIG. 8G, the exposed part of the patterned ohm contact layer 240a and the patterned semi-conducting layer 230a are etched to form the patterned ohm contact layer 240b and the patterned semi-conducting layer 230b. The patterned ohm contact layer 240b and the patterned semi-conducting layer 230b respectively include a patterned ohm contact layer 241b and a patterned semi-conducting layer 231b. The patterned ohm contact layer 241b and patterned semi-conducting layer 231b cover the patterned insulating layer 220a on the gate electrode 121. Then, the remaining patterned photoresist layer 290c is removed.

Figure 9A:
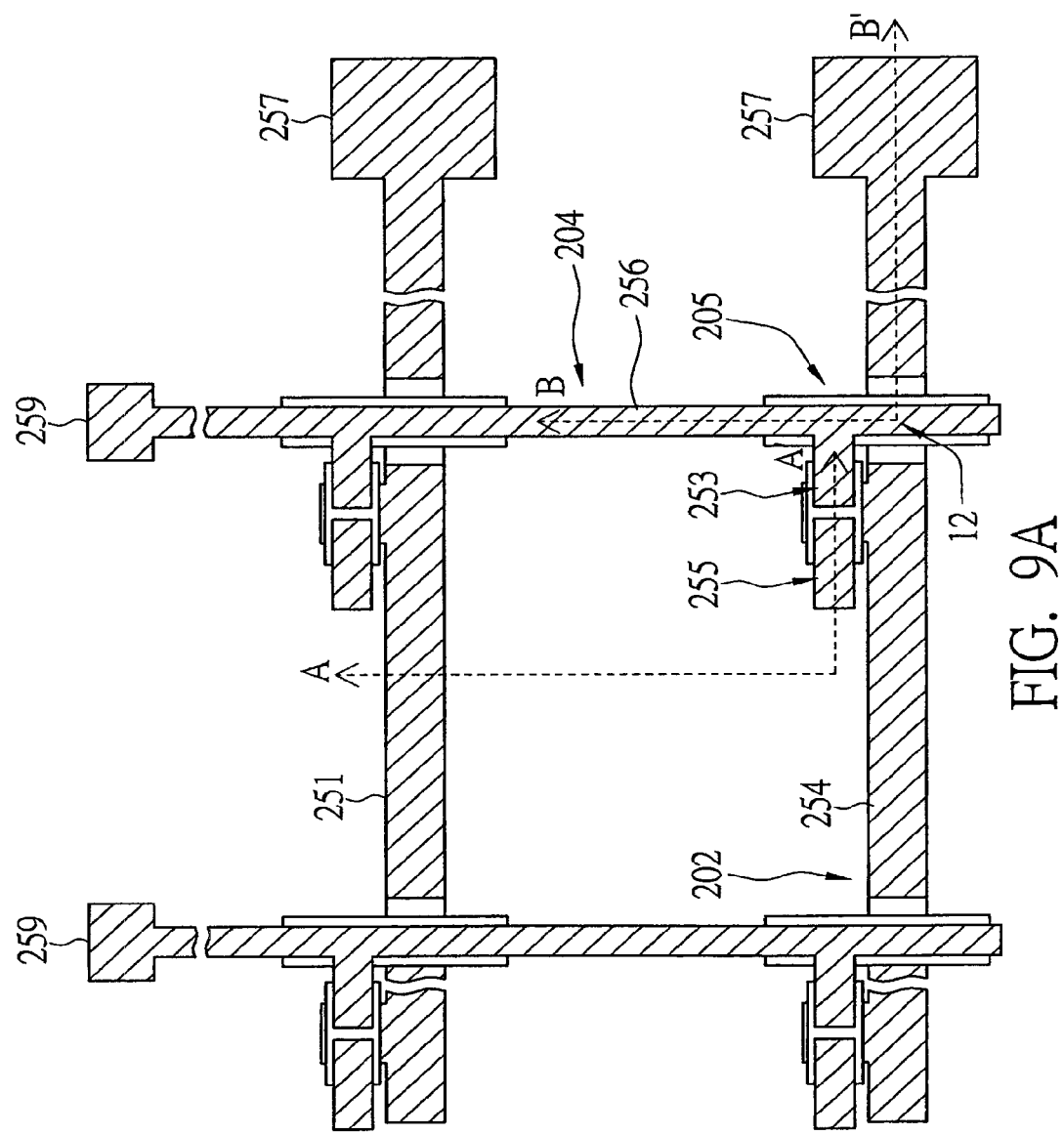
FIG. 9A illustrates the pixel structure of the second embodiment after the third mask process.
Figure 9B:
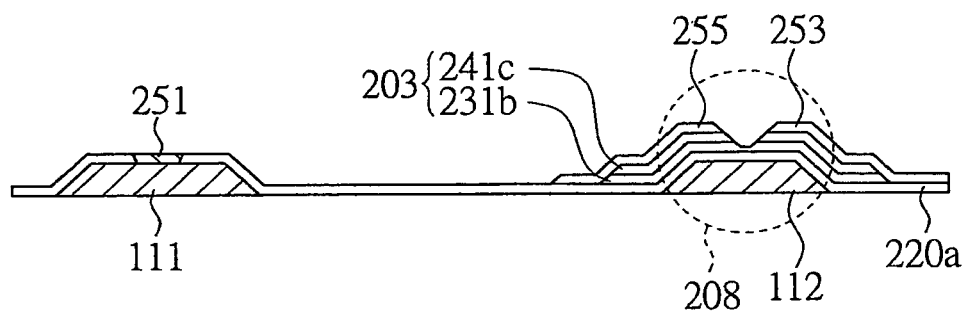
FIG. 9B is a cross-sectional view taken along line AA' in FIG. 9A.
Figure 9C:
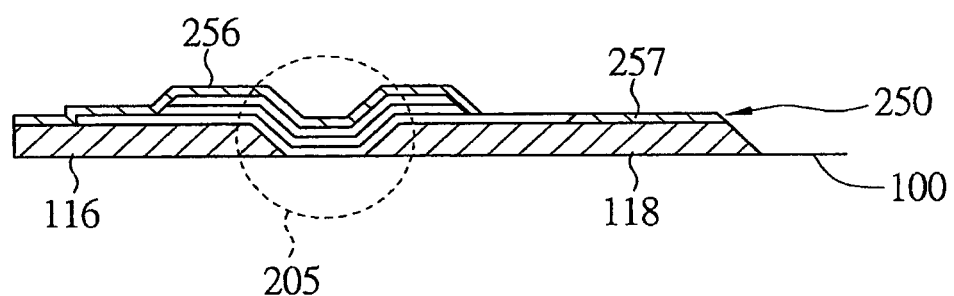
FIG. 9C is a cross-sectional view taken along line BB' in FIG. 9A.

Referring to FIGS. 9A~9C at the same time, the pixel structure of the second embodiment after the third mask process and cross-sectional views taken along lines AA' and BB' in FIG. 9A are illustrated, respectively. As shown in the step 24, a patterned second metal layer 250 is formed by the third mask process. The patterned second metal layer 250 includes a source 253, and a drain 255, a second scan metal layer 254 and a second data metal layer 256. The first data metal segment 116 and the second data metal layer 256 constitute a data line 204 electrically connected to the source 253. The first scan metal layer 114 and the second scan metal layer 254 constitute a scan line 202 electrically connected to the gate electrode 112. Furthermore, the scan line 202 and the data line 204 are interlaced with each other in the interlacing region 12.

Besides, as shown in FIG. 9A and FIG. 9C, the second data metal layer 256 is disposed on the separating layer 205 and across the interlacing region 12.

In addition, a patterned second metal layer 251 is formed on the patterned first metal layer 111, and patterned second metal layers 257, 259 are formed to couple to the scan pad 118 and the data pad 119 in the step 24 at the same time.

Then, as shown in the step 25, the patterned ohm contact layer 241b is etched to become a patterned ohm contact layer 241c. The source 253 and the drain 255 are formed on the patterned semi-conducting layer 231b and the patterned ohm contact layer 241c and constitute an active element 208, such as a thin film transistor, with the gate electrode 112. The patterned semi-conducting layer 231b and the patterned ohm contact layer 241c constitute a channel layer 203, as shown in FIG. 9B.

As shown in FIGS. 9A~9C, the data line 204 and the source 253 are coupled to each other. The data line 204 includes the first data metal segment 116 and the second data metal layer 256. The second data metal layer 256 is disposed on the first data metal segment 116. The data line 204 further includes the separating layer 205 disposed across the scan line 202. The second data metal layer 256 is disposed on the separating layer 205.

Figure 10A:
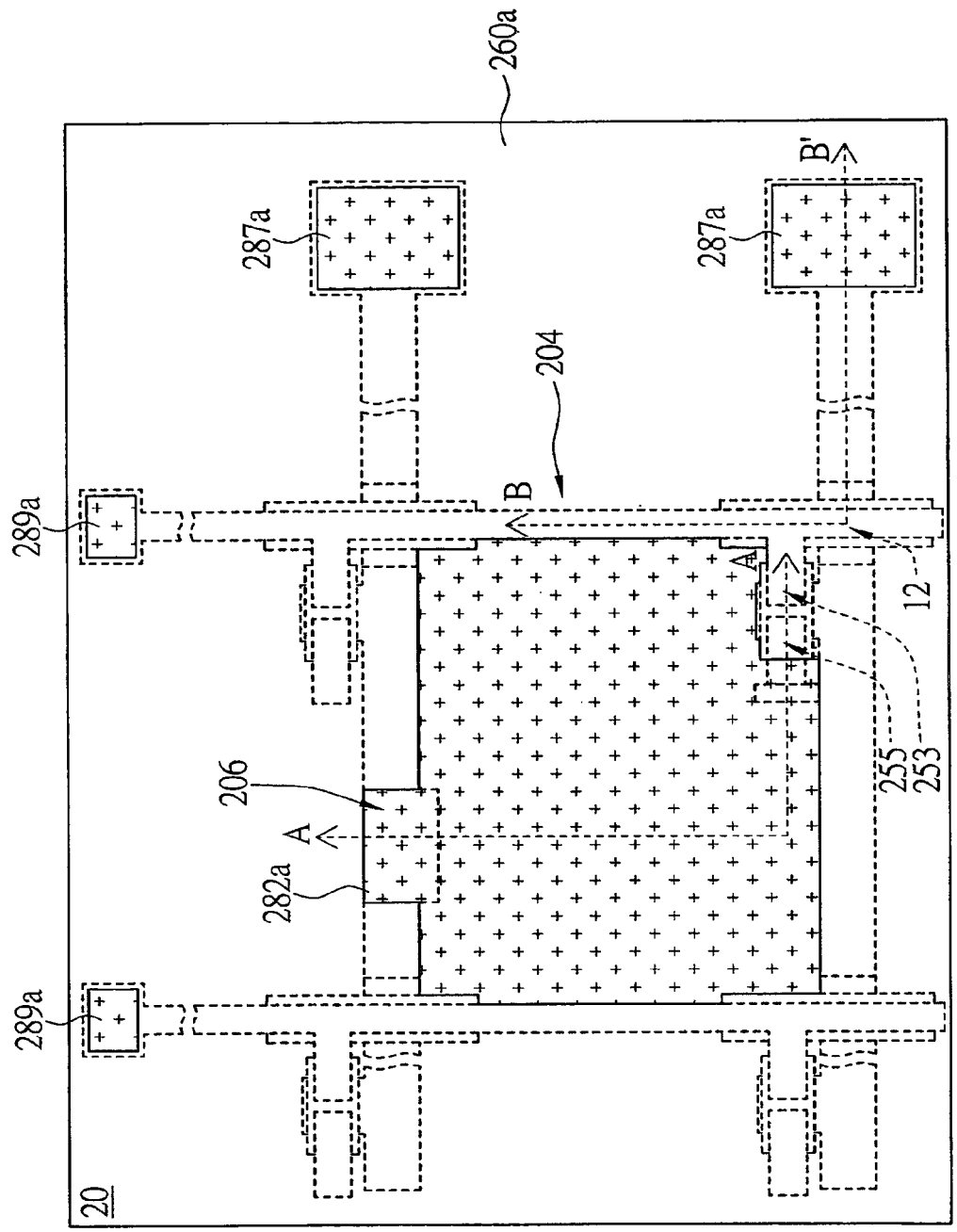
FIG. 10A illustrates the pixel structure of the second embodiment after the fourth mask process.
Figure 10B:
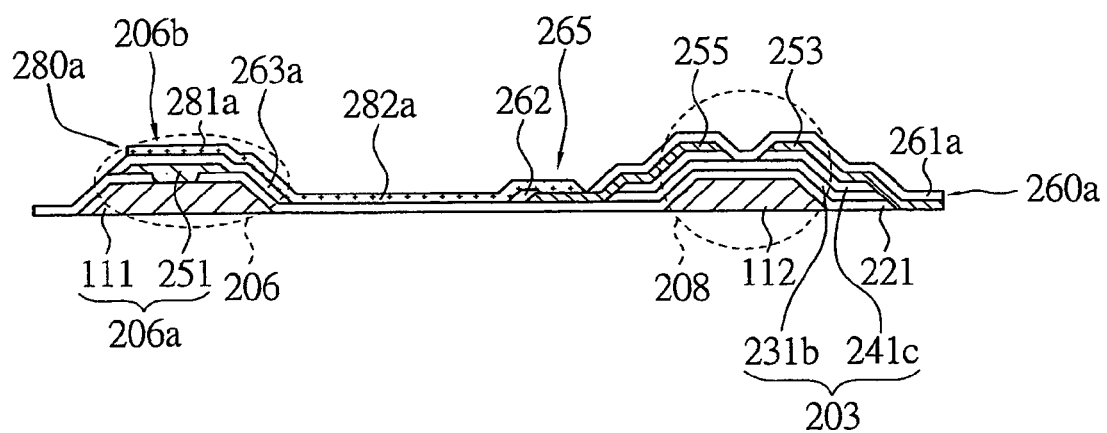
FIG. 10B is a cross-sectional view taken along line AA' in FIG. 10A.
Figure 10C:
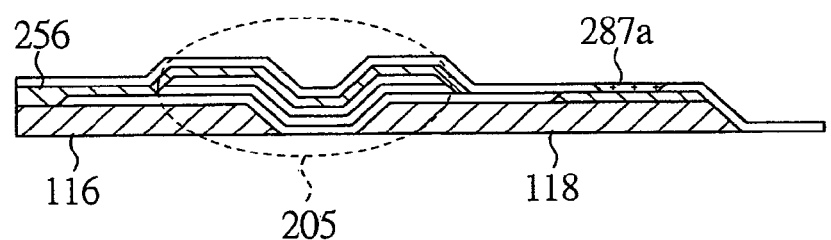
FIG. 10C is a cross-sectional view taken along line BB' in FIG. 10A.

Referring to FIGS. 10A~10C at the same time, the pixel structure of the second embodiment after the fourth mask process and cross-sectional views taken along lines AA' and BB' in FIG. 10A are illustrated, respectively. As shown in the step 26, a patterned passivation layer 260a is formed by the fourth mask process. The patterned passivation layer 260a partially covers a part edge of the drain 255.

After that, as shown in the step 27, a patterned transparent conductive layer 280a including a pixel electrode 282a is formed. The pixel electrode 282a is disposed across the patterned passivation layer 262a on the part edge of the drain 255 and electrically connected to the drain 255. In addition, pattern transparent conductive layers 287a, 289a of the patterned transparent conductive layer 280a are coupled to the patterned second metal layers 257, 259, respectively.

As shown in FIG. 10B, the pixel electrode 282a is disposed across the second passivation layer 262a and coupled to the drain 255 via the contact hole 265.

Figure 10D:
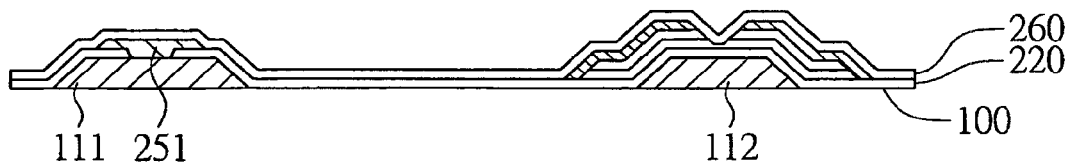
FIGS. 10D~10I illustrate the detail steps of the fourth mask process of the second embodiment.

The steps 26~27 are elaborated in FIGS. 10D~10I. Referring to FIGS. 10D~10I, the detail steps of the fourth mask process of the second embodiment are illustrated. As shown in FIG. 10D, a passivation material layer 260 is firstly formed.

Figure 10E:
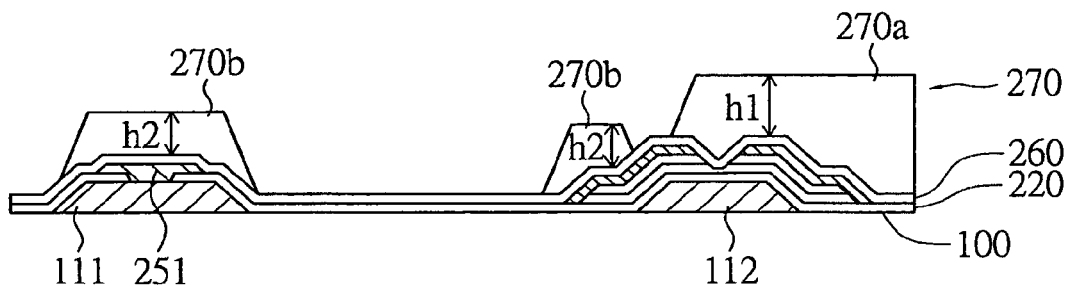

Then, as shown in FIG. 10E, a patterned photoresist layer 270 is formed on the passivation material layer 260. The patterned photoresist layer 270 includes a patterned photoresist layer 270a with the thickness h1 and a patterned photoresist layer 270b with the thickness h2. The thickness h1 is greater than the thickness h2.

Figure 10F:
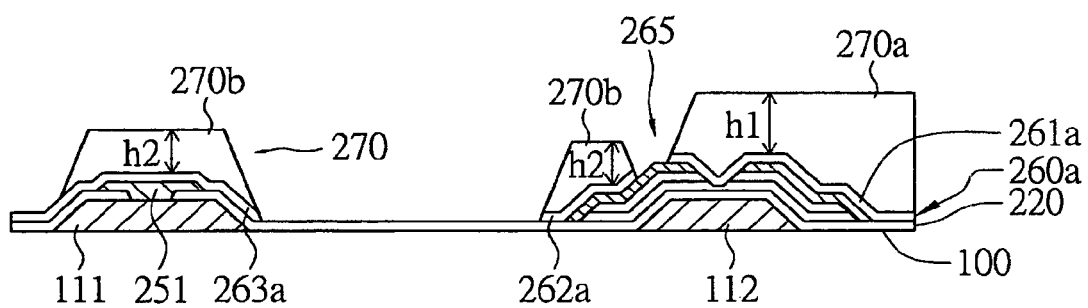

After that, as shown in FIG. 10F, the passivation material layer 260 is etched to form the patterned passivation layer 260a. The patterned passivation layer 260a includes a first passivation layer 261a, a second passivation layer 262a and a third passivation layer 263a. The first passivation layer 261a and the second passivation layer 262a form the contact hole 265 to expose the drain 255. The second passivation layer 262a covers the part edge of the drain 255, and the third passivation layer 263a covers the patterned second metal layer 251.

Figure 10G:
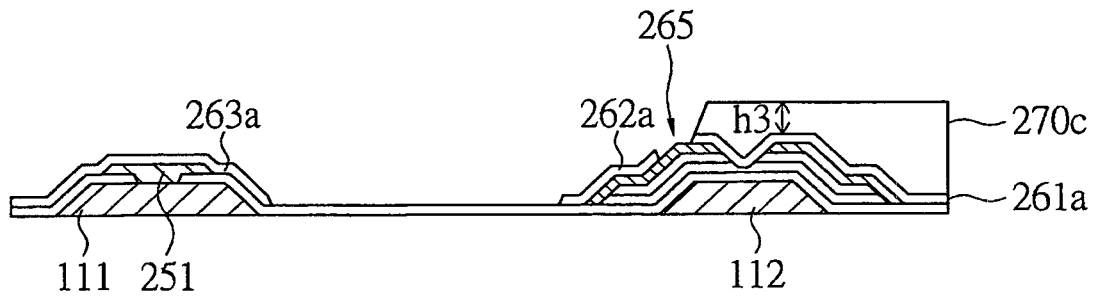

Then, as shown in FIG. 10G, the patterned photoresist layer 270 is ashed to expose the second passivation layer 262a. After the patterned photoresist layer 270 is ashed, the patterned photoresist layer 270b is removed. Therefore, the original patterned photoresist layer 270a becomes a patterned photoresist layer 270c with the thickness h3.

Figure 10H:
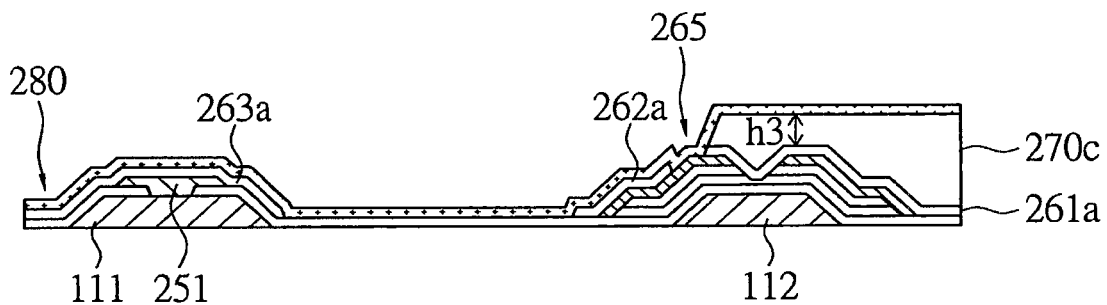

After that, as shown in FIG. 10H, a transparent conductive layer 280 is formed. The transparent conductive layer 280 is coupled to the drain 255 via the contact hole 265.

Figure 10I:
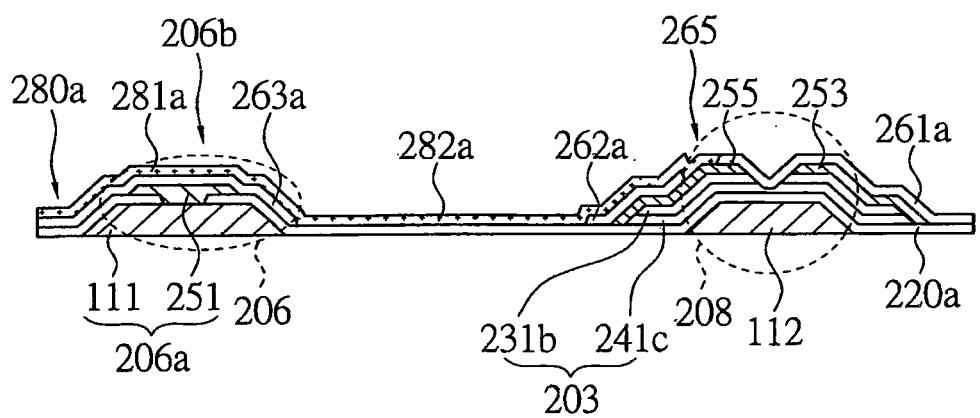

Then, as shown in FIG. 10I, the remaining patterned photoresist layer 270c is removed and part of the transparent conductive layer 280 on the remaining patterned photoresist layer 270c is also removed concurrently so as to form the patterned transparent conductive layer 280a. The patterned transparent conductive layer 280a includes the pixel electrode 282a and the patterned transparent conductive layer 281a. The patterned transparent conductive layer 281a covers the third passivation layer 263a. Heretofore, the pixel structure 20 is completed. The step of removing the remaining patterned photoresist layer 270c includes the lift-off process. Preferably, the patterned photoresist layer 270c is removed by using chemicals or performing the laser lift-off process.

As shown in FIG. 10A and FIG. 10B, the pixel structure 20 includes the active element 208, the first passivation layer 261a, the second passivation layer 262a, the third passivation layer 263a, the storage capacitor 206, the data line 202 and the pixel electrode 282a. The active element 208 is closely adjacent to the interlacing region 12 and electrically coupled to the scan line 202 and the data line 204. The active element 208 includes the gate electrode 112, the patterned insulating layer 220a, the channel layer 203, the source 253 and the drain 255. The gate electrode 112 and the scan line 202 are electrically connected to each other. The patterned insulating layer 220a is positioned on the gate electrode 112. The channel layer 203 is positioned on the patterned insulating layer 220a above the gate electrode 112. The source 253 and the drain 255 are positioned on the channel layer 203, and the source 253 is coupled to the data line 204. The channel layer 203 includes the patterned ohm contact layer 241c and the patterned semi-conducting layer 231b. The patterned ohm contact layer 241c is disposed on the patterned semi-conducting layer 231b.

As shown in FIG. 10I, the first passivation layer 261a and the second passivation layer 262a cover the active element 208 and form the contact hole 265 to expose the part of the drain 255. The second passivation layer 262a covers the part edge of the drain 255.

As shown in FIG. 10I, the storage capacitor 206 has a first capacitance metal layer 206a and a second capacitance metal layer 206b. The second capacitance metal layer 206b is disposed on the first capacitance metal layer 206a. The first capacitance metal layer 260a includes the patterned first metal layer 111 and the patterned second metal layer 251. The second capacitance metal layer 206b includes the patterned transparent conductive layer 281a. A capacitance insulating layer includes the third passivation layer 263a disposed between the first capacitance metal layer 206a and the second capacitance metal layer 206b. Therefore, in the embodiment, the storage capacitor 206 composed of a metal layer, an insulator and a transparent layer (such as ITO) is called MII capacitance structure.

Third Embodiment

The method for manufacturing a pixel structure of the third embodiment differs from that of the first embodiment in using a halftone mask or a gray-tone mask in the second mask process. Therefore, an insulating layer and a semi-conducting layer of the pixel structure of the third embodiment are formed with different patterns, respectively. In addition, the patterns of a passivation layer and a transparent conductive layer are defined by the fourth mask process and the fifth mask process, respectively.

Figure 11:
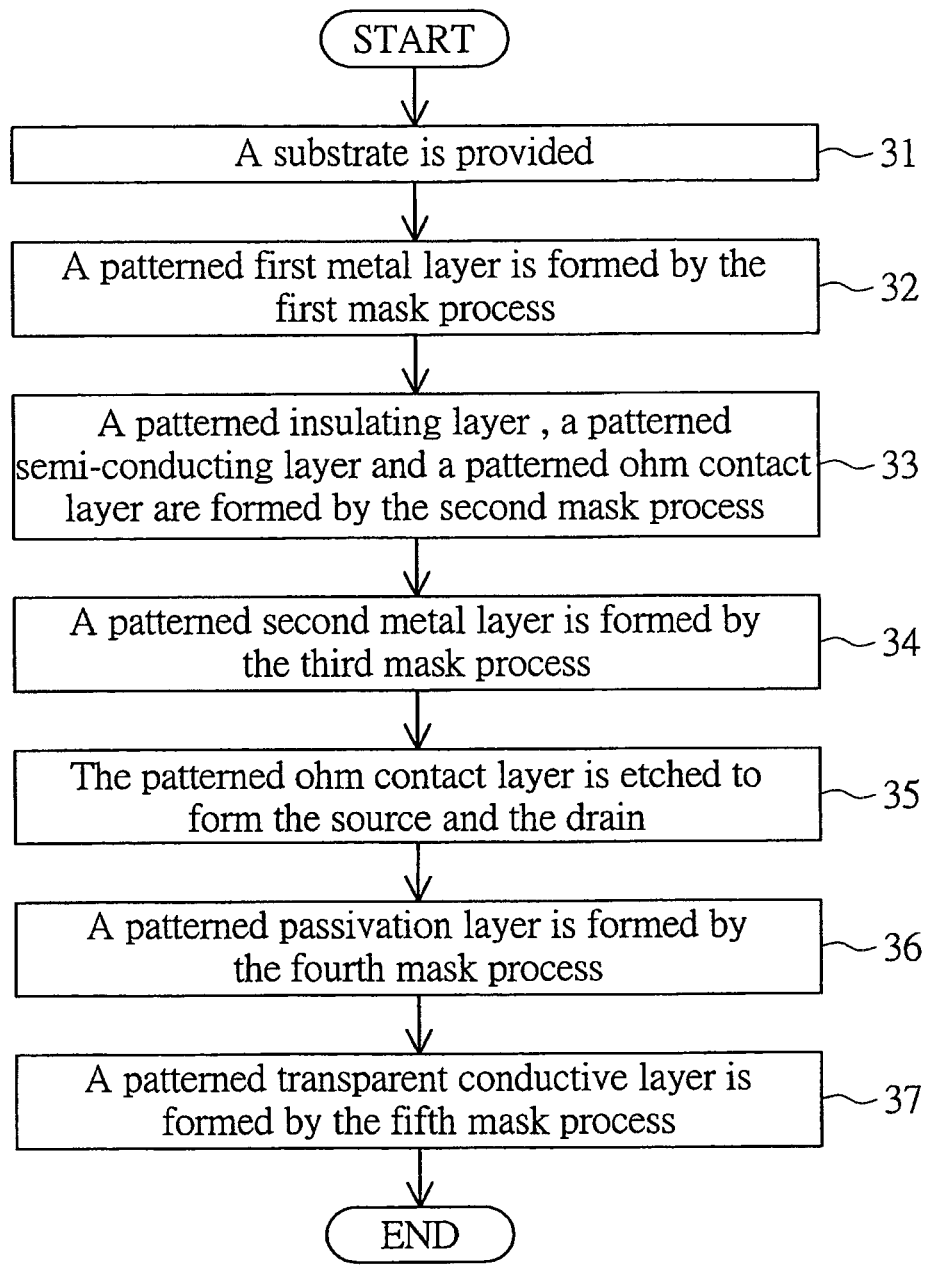
FIG. 11 is a flow chart of a method for manufacturing a pixel structure according to the third embodiment of the invention.

Referring to FIG. 11, a flow chart of a method for manufacturing a pixel structure according to the third embodiment of the invention is illustrated.

Figure 12A:
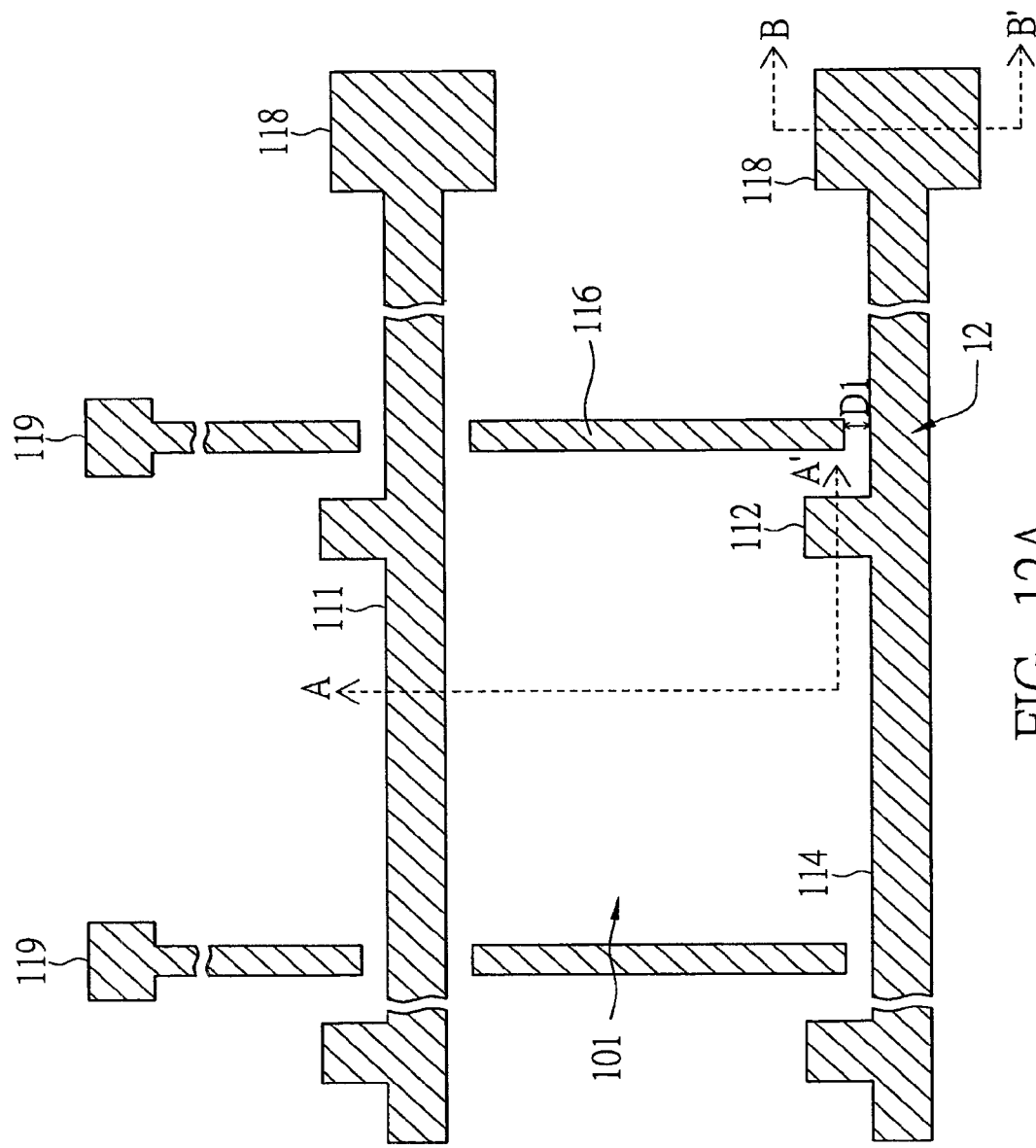
FIG. 12A illustrates the pixel structure of the third embodiment after the first mask process.
Figure 12B:
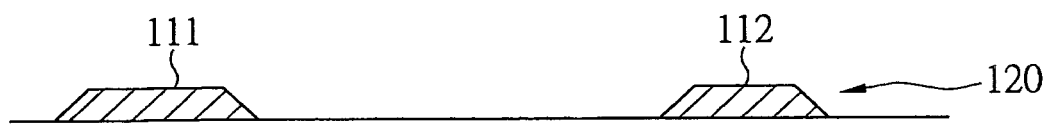
FIG. 12B is a cross-sectional view taken along line AA' in FIG. 12A.
Figure 12C:
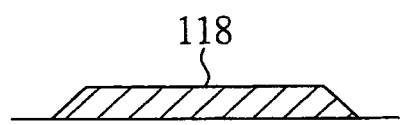
FIG. 12C is a cross-sectional view taken along line BB' in FIG. 12A.

Referring to FIGS. 12A~12C at the same time, the pixel structure of the third embodiment after the first mask process and cross-sectional views taken along lines AA' and BB' in FIG. 12A are illustrated, respectively.

Please refer to FIG. 12A. First, as shown in the step 31, a substrate 100 is provided. Then, as shown in the step 32, a patterned first metal layer 110 is formed on the substrate 100 by the first mask process. The patterned first metal layer 110 includes a gate electrode 112, a first scan metal layer 114 and a first data metal segment 116. The first scan metal layer 114 and the first data metal segment 116 surround a display area 101 and the first scan metal layer 114 has an interlacing region 12, and the first data metal segment 116 and the interlacing region 12 are spaced at a first distance D1. In addition, as shown in FIG. 12B, the patterned first metal layer 110 further includes a patterned first metal layer 111 disposed on the substrate 100. In addition, as shown in FIG. 12C, the patterned first metal layer 110 further includes a scan pad 118 and a data pad 119 disposed on the substrate 100 and electrically connected to the first scan metal layer 114 and the first data metal segment 116, respectively. Basically, the steps 31, 32 and the steps 11, 12 of the first embodiment are the same, respectively.

Figure 13A:
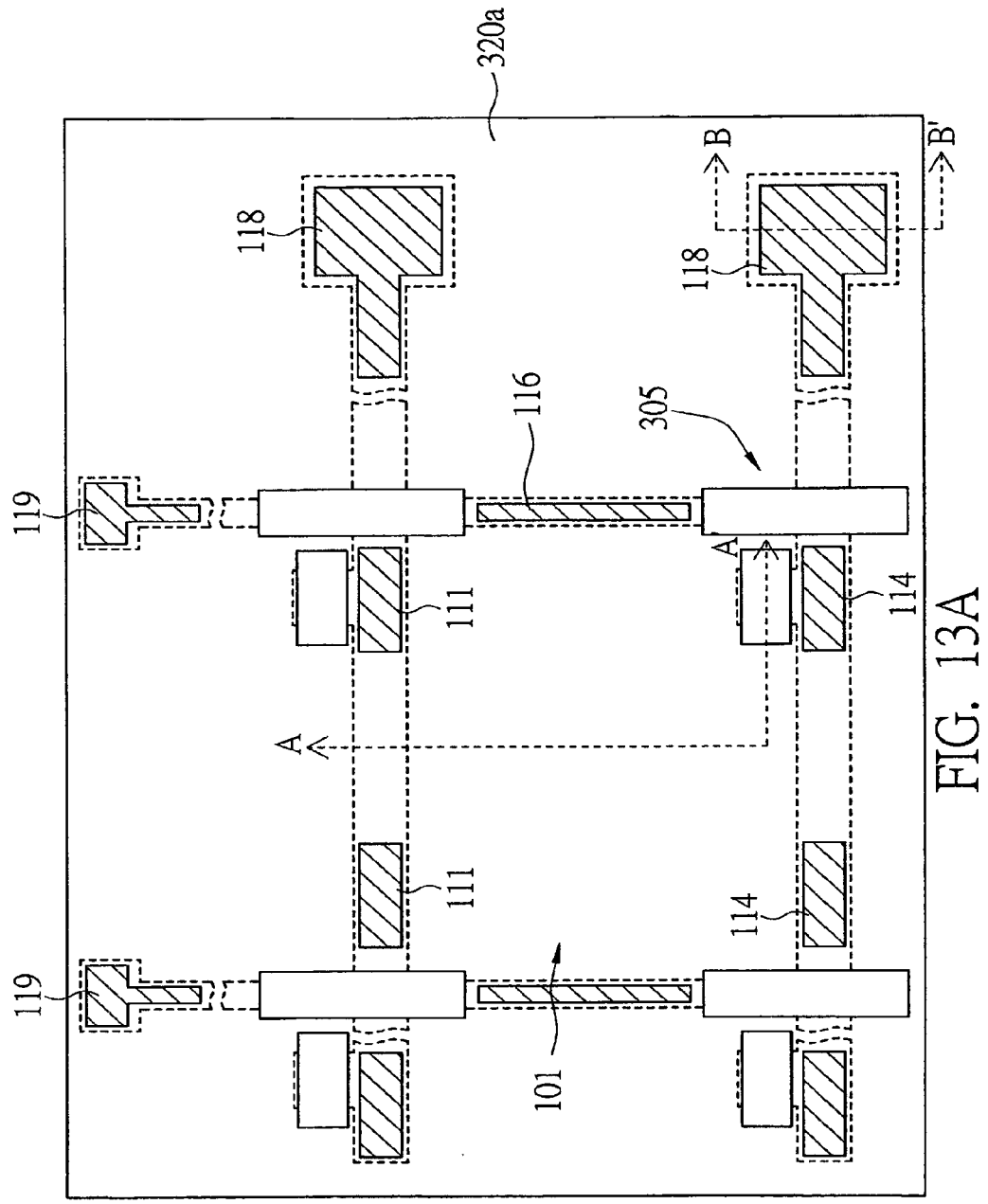
FIG. 13A illustrates the pixel structure of the third embodiment after the second mask process.
Figure 13B:
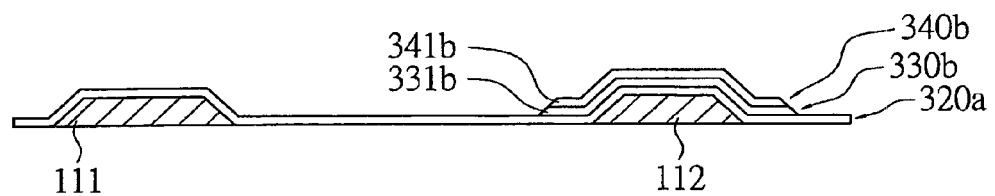
FIG. 13B is a cross-sectional view taken along line AA' in FIG. 13A.
Figure 13C:
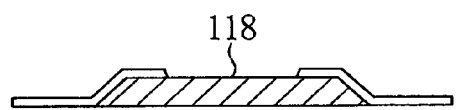
FIG. 13C is a cross-sectional view taken along line BB' in FIG. 13A.

Referring to FIGS. 13A~13C at the same time, the pixel structure of the third embodiment after the second mask process and cross-sectional views taken along lines AA' and BB' in FIG. 13A are illustrated, respectively. Then, as shown in the step 33, a patterned insulating layer 320a, a patterned semi-conducting layer 330b and a patterned ohm contact layer 340b are formed by the second mask process. The step 33 differs from the step 13 of the first embodiment in using a halftone mask or a gray-tone mask to form a patterned photoresist layer with different thicknesses. Therefore, the pattern of the patterned insulating layer 320a is different from the patterns of the patterned semi-conducting layer 330b and the patterned ohm contact layer 340b. Besides, the patterned insulating layer 320a covers the display area 101 and exposes the first scan metal layer 114, the first data metal segment 116, the patterned first metal layer 111, the scan pad 118 and the data pad 119.

Besides, as shown in FIG. 13A, a separating layer 305 disposed across the first scan metal layer 114 in the interlacing region 12 is formed.

Figure 13D:
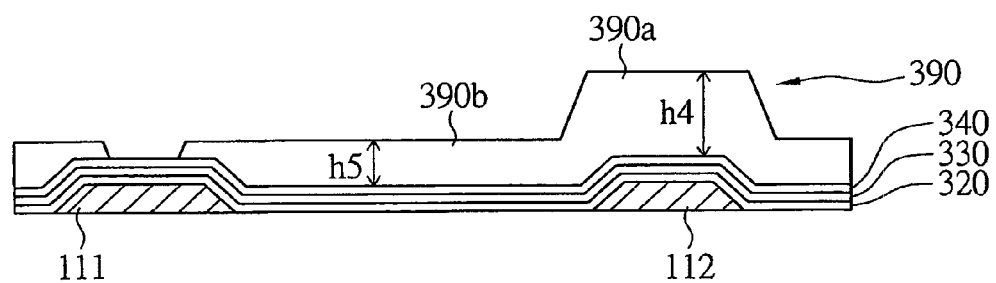
FIGS. 13D~13G illustrate the detail steps of the second mask process of the third embodiment.

The step 33 is elaborated in FIGS. 13D~13G. Referring to FIGS. 13D~13G, the detail steps of the second mask process of the third embodiment are illustrated. As shown in FIG. 13D, an insulating material layer 320, a semi-conducting material layer 330 and an ohm contact material layer 340 are sequentially deposited on the patterned first metal layer 110.

Then, a patterned photoresist layer 390 is formed on the semi-conducting material layer 330. The patterned photoresist layer 390 includes a patterned photoresist layer 390a with the thickness h4 and a patterned photoresist layer 390b with the thickness h5. The thickness h4 is greater than the thickness h5.

Figure 13E:
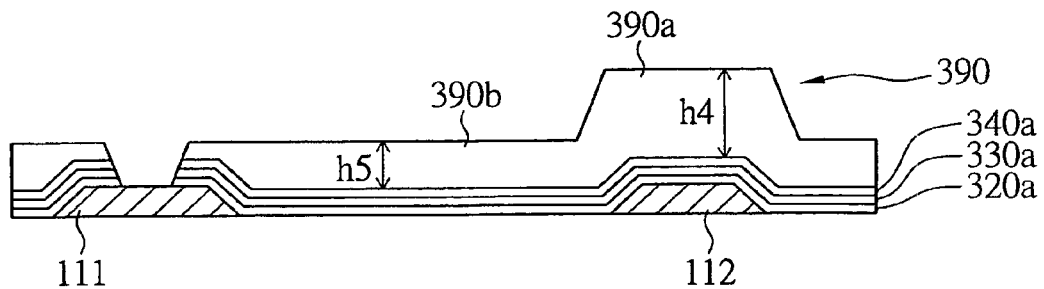

After that, as shown in FIG. 13E, the ohm contact material layer 340, the semi-conducting material layer 330 and the insulating material layer 320 are etched to form the patterned ohm contact layer 340a, the patterned semi-conducting layer 330a and the patterned insulating layer 320a by using the patterned photoresist layer 390 as a mask. The pattered insulating layer 320a exposes the first scan metal layer 114, the first data metal segment 116, the patterned first metal layer 111, the scan pad 118 and the data pad 119.

Figure 13F:
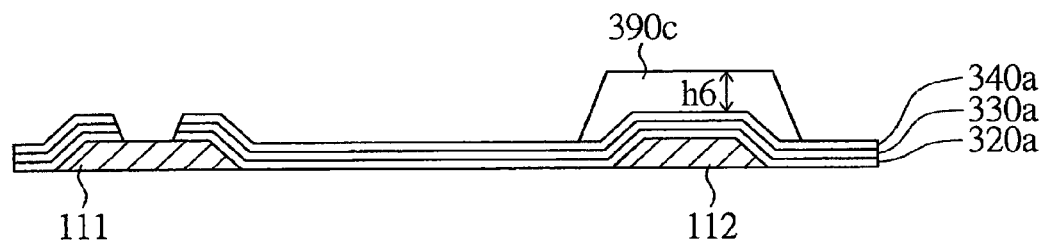

Then, as shown in FIG. 13F, the patterned photoresist layer 390b with the thickness h5 is ashed to expose the patterned ohm contact layer 340a and the patterned semi-conducting layer 330a. The patterned photoresist layer 390a with the thickness h4 is cut off to form a patterned photoresist layer 390c with the thickness h6.

Figure 13G:
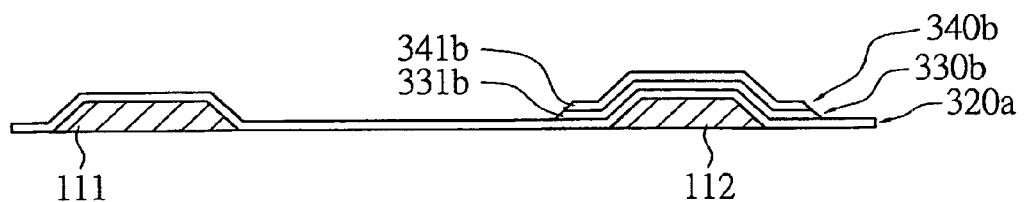

After that, as shown in FIG. 13G, the exposed part of the patterned ohm contact layer 340a and the patterned semi-conducting layer 330a are etched to form the patterned ohm contact layer 340b and the patterned semi-conducting layer 330b. The patterned ohm contact layer 340b and the patterned semi-conducting layer 330b respectively include a patterned ohm contact layer 341b and a patterned semi-conducting layer 331b positioned on the patterned insulating layer 320a above the gate electrode 112. Then, the remaining patterned photoresist layer 390c is removed.

Figure 14A:
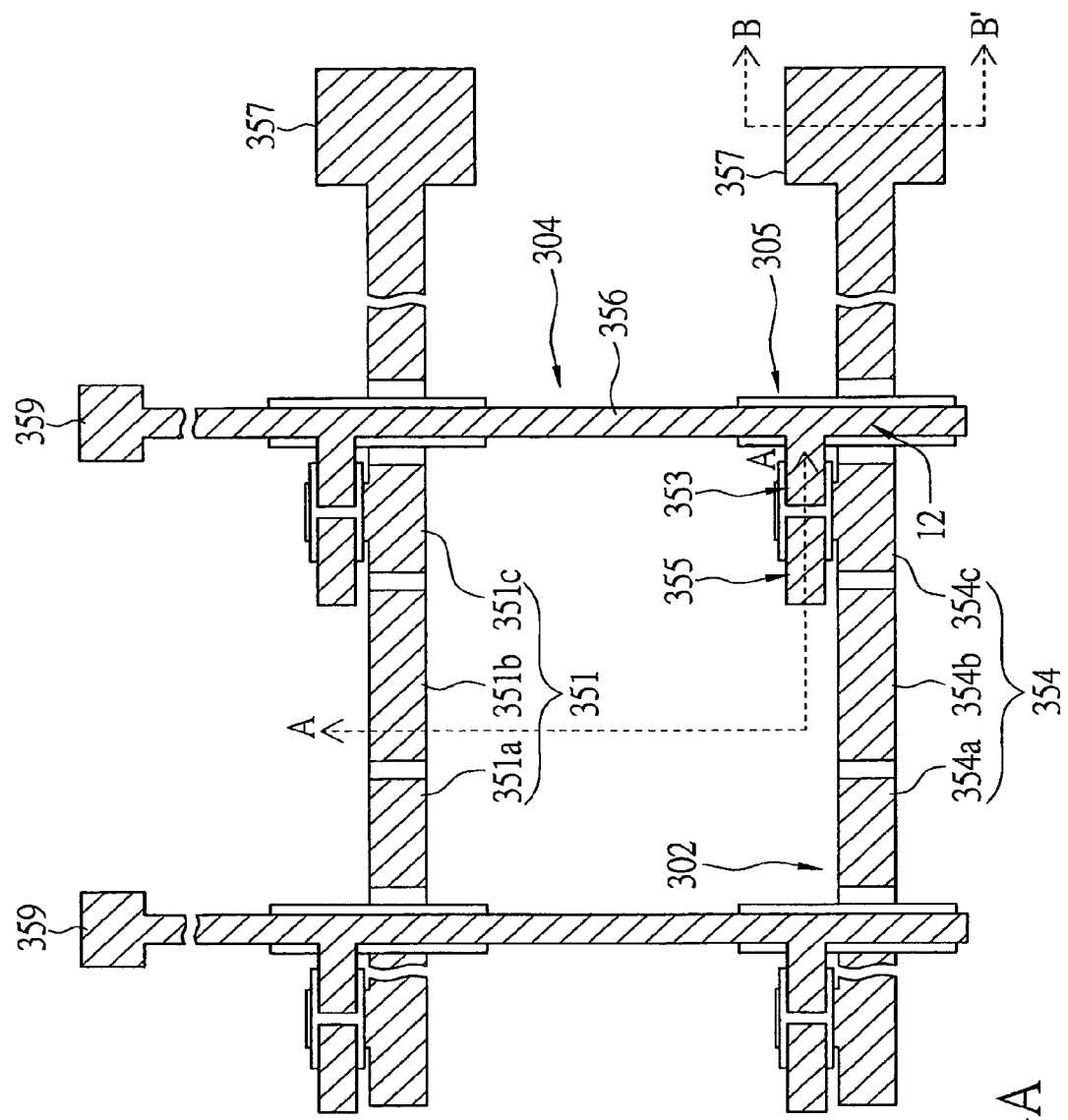
FIG. 14A illustrates the pixel structure of the third embodiment after the third mask process.
Figure 14B:
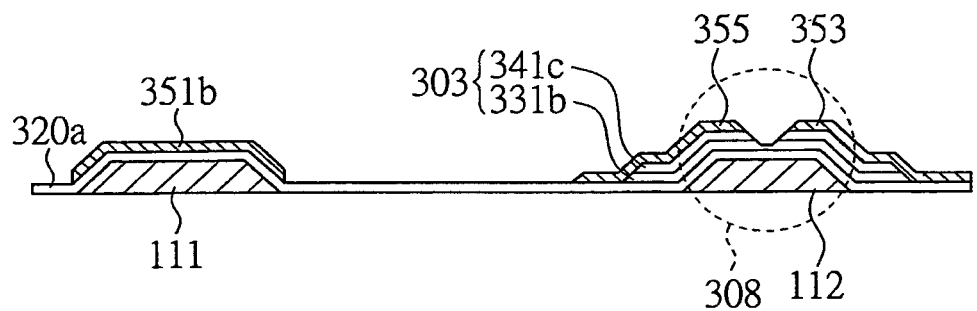
FIG. 14B is a cross-sectional view taken along line AA' in FIG. 14A.
Figure 14C:
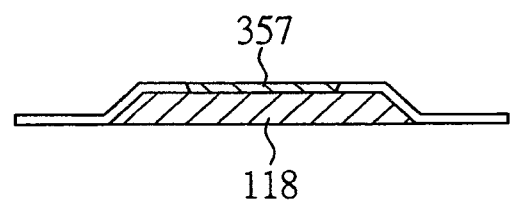
FIG. 14C is a cross-sectional view taken along line BB' in FIG. 14A.

Referring to FIGS. 14A~14C at the same time, the pixel structure of the third embodiment after the third mask process and cross-sectional views taken along lines AA' and BB' in FIG. 14A are illustrated, respectively. As shown in the step 34, a patterned second metal layer 350 is formed by the third mask process. The patterned second metal layer 350 includes a source 353, a drain 355, a second scan metal layer 354 and a second data metal layer 356. The first data metal segment 116 and the second data metal layer 356 constitute a data line 304 electrically connected to the source 353. The first scan metal layer 114 and the second scan metal layer 354 constitute a scan line 302 electrically connected to the gate electrode 112. Patterned second metal layers 357, 359 are formed in the step 34 at the same time to couple to the scan pad 118 and the data pad 119, respectively. Furthermore, the scan line 302 and the data line 304 are interlaced with each other in the interlacing region 12.

As shown in FIG. 14A, the second scan metal layer 354 includes several separate second scan metal segments 354a, 354b, 354c. The second scan metal segments 354a, 354c are coupled to the first scan metal layer 114 exposed by the patterned insulating layer 320a. The second scan metal segment 354b is formed on the patterned insulating layer 320a and electrically isolated from the first scan metal layer 114.

Besides, as shown in FIG. 14A, the data line 304 and the source 353 are coupled to each other. The data line 304 includes the first data metal segment 116 and the second data metal layer 356. The second data metal layer 356 is disposed on the first data metal segment 116 and across the interlacing region 12. The data line 304 further includes the separating layer 305 disposed across the scan line 302. The second data metal layer 356 is disposed on the separating layer 305.

In addition, as shown in FIG. 14A, a patterned second metal layer 351 is formed in the step 34 at the same time. The patterned second metal layer 351 includes separate patterned second metal layers 351a, 351b, 351c. The patterned second layers 351a, 351c are coupled to the patterned first metal layer 111 exposed by the patterned insulating layer 320a. The patterned second metal layer 351b is formed on the patterned insulating layer 320a and electrically isolated from the patterned first metal layer 111.

Then, as shown in the step 35, the patterned ohm contact layer 341b is etched to form a patterned ohm contact layer 341c. The source 353 and the drain 355 are formed on the patterned semi-conducting layer 331b and the patterned ohm contact layer 341c and constitute an active element 308, such as a thin film transistor, with the gate electrode 112. The patterned semi-conducting layer 331b and the patterned ohm contact layer 341c constitute a channel layer 303.

Figure 15A:
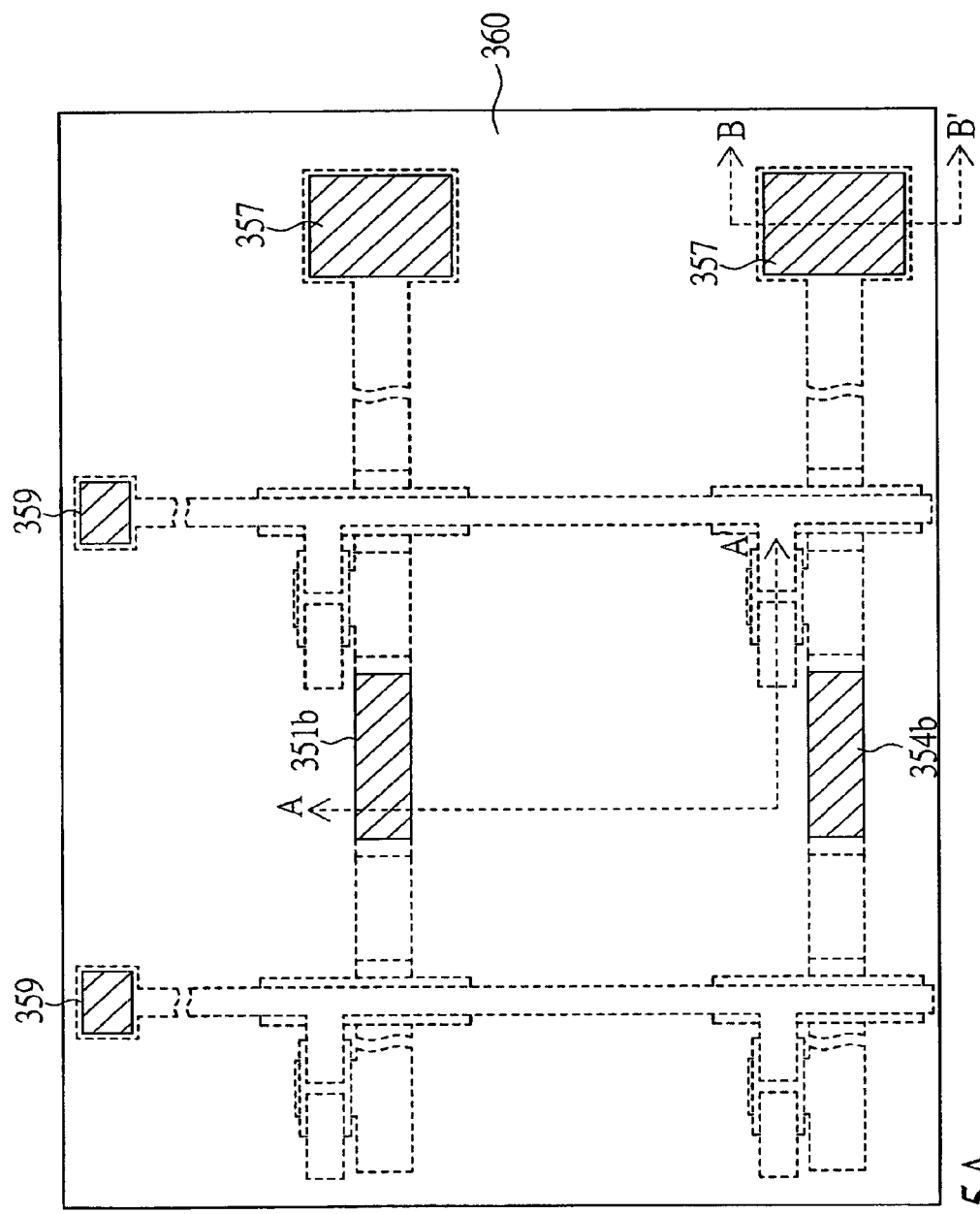
FIG. 15A illustrates the pixel structure of the third embodiment after the fourth mask process.
Figure 15B:
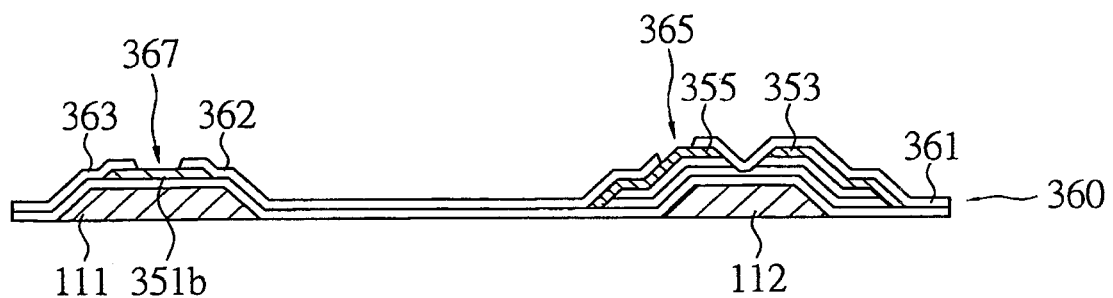
FIG. 15B is a cross-sectional view taken along line AA' in FIG. 15A.
Figure 15C:
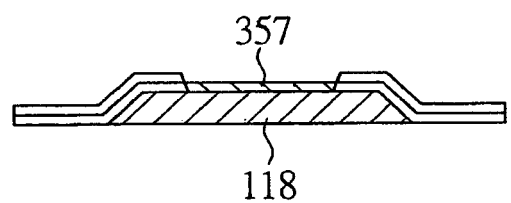
FIG. 15C is a cross-sectional view taken along line BB' in FIG. 15A.

Referring to FIGS. 15A~15C at the same time, the pixel structure of the third embodiment after the fourth mask process and cross-sectional views taken along lines AA' and BB' in FIG. 15A are illustrated, respectively. As shown in the step 36, a patterned passivation layer 360 is formed by the fourth mask process. The patterned passivation layer 360 includes a first passivation layer 361 and a second passivation layer 362. The first passivation layer 361 and the second passivation layer 362 form a contact hole 365 to expose the drain 355. The second passivation layer 362 covers a part edge of the drain 355.

In addition, the patterned passivation layer 360 further includes a third passivation layer 363. The third passivation layer 363 covers the patterned second metal layer 351b and forms a contact hole 367 to expose the patterned second metal layer 351b. However, the invention is not limited thereto. The third passivation layer 363 can only cover an edge of the patterned second metal layer 351b.

Besides, the patterned passivation layer 360 also exposes the second scan metal segment 354b and the patterned second metal layers 357, 359 to couple to a transparent conductive layer formed later.

Figure 16A:
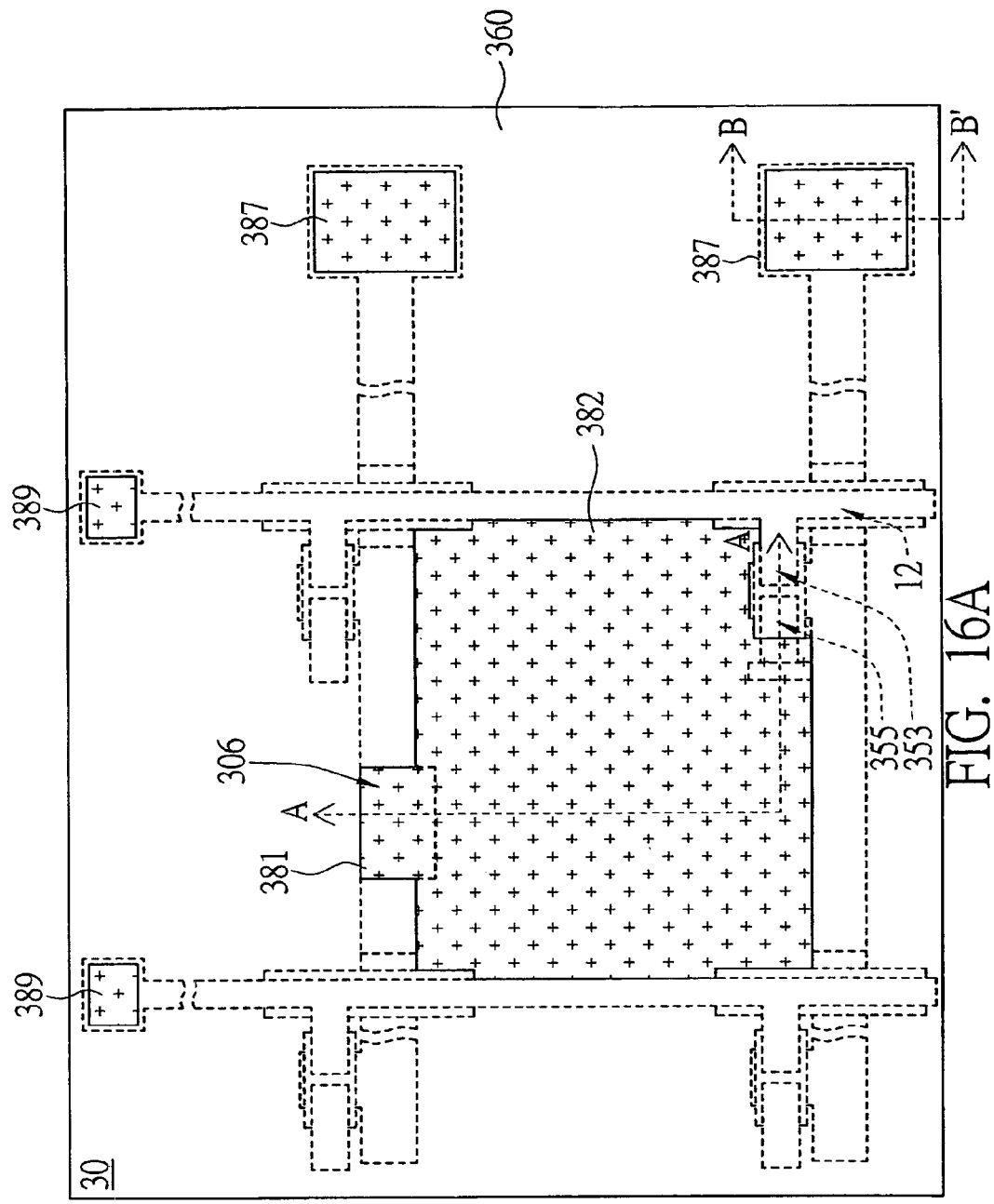
FIG. 16A illustrates the pixel structure of the third embodiment after the fifth mask process.
Figure 16B:
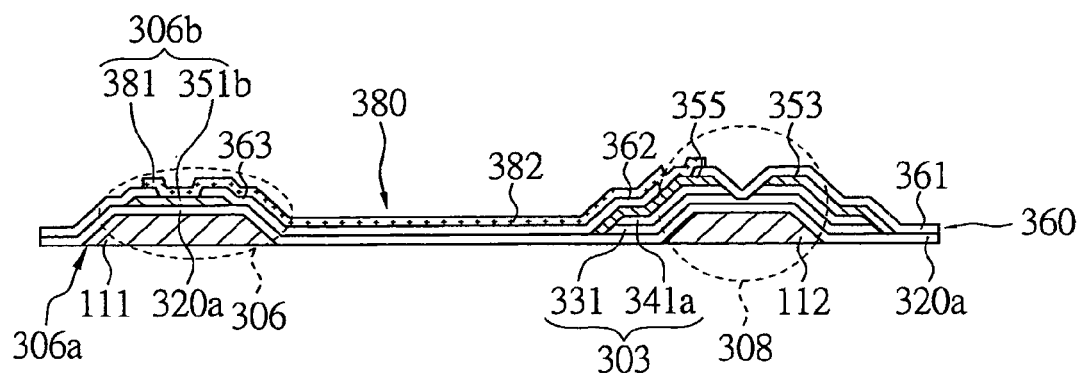
FIG. 16B is a cross-sectional view taken along line AA' in FIG. 16A.
Figure 16C:
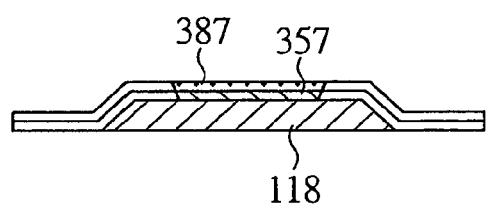
FIG. 16C is a cross-sectional view taken along line BB' in FIG. 16A.

Referring to FIGS. 16A~16C at the same time, the pixel structure of the third embodiment after the fifth mask process and cross-sectional views taken along lines AA' and BB' in FIG. 16A are illustrated, respectively. As shown in the step 37, a patterned transparent conductive layer 380 is formed by the fifth mask process. The patterned transparent conductive layer 380 includes a pixel electrode 382. The pixel electrode 382 is disposed across the patterned passivation layer 362 on the part edge of the drain 355 to be electrically connected to the drain 355. In addition, patterned transparent conductive layers 387, 389 of the patterned transparent conductive layer 380 are coupled to the patterned second metal layers 357, 359, respectively.

Besides, the patterned transparent conductive layer 380 further includes a patterned transparent conductive layer 381 and the patterned transparent conductive layers 387, 389. The patterned transparent conductive layers 381, 387, 389 are coupled to the patterned second metal layers 351b, 357, 359, respectively. Heretofore, the pixel structure 30 is completed.

As shown in FIG. 16A and FIG. 16B, the pixel structure 30 includes the active element 308, the first passivation layer 361, the second passivation layer 362, the storage capacitor 306, the data line 302 and the pixel electrode 382. The active element 308 is closely adjacent to the interlacing region 12 and connected to the scan line 302 ad the data line 304. The active element 308 includes the gate electrode 112, the patterned insulating layer 320a, the channel layer 303, the source 353 and the drain 355. The gate electrode 112 and the scan line 302 are electrically connected to each other. The patterned insulating layer 320a is positioned on the gate electrode 112. The channel layer 303 is positioned on the patterned insulating layer 320a above the gate electrode 112. The source 353 and the drain 355 are positioned on the channel layer 303, and the source 353 is coupled to the data line 304.

As shown in FIG. 16B, the storage capacitor 306 has a first capacitance metal layer 306a and a second capacitance metal layer 306b. The second capacitance metal layer 306b is disposed on the first capacitance metal layer 306a. The first capacitance metal layer 306a includes the patterned first metal layer 111, and the second capacitance metal layer 306b includes the patterned second metal layer 351b and the patterned transparent conductive layer 381. A capacitance insulating layer includes a part of the patterned insulating layer 320a disposed between the first capacitance metal layer 306a and the second capacitance metal layer 306b. Therefore, in the embodiment, the storage capacitor 306 composed of a metal layer, an insulator and a metal layer is called MIM capacitance structure.

Fourth Embodiment

The method for manufacturing a pixel structure of the fourth embodiment differs from that of the first embodiment. The patterns of a semi-conducting layer and an insulating layer in the fourth embodiment are defined by the second mask process and the third mask process, respectively. The pattern of a second metal layer is defined by the fourth mask process.

Figure 17:
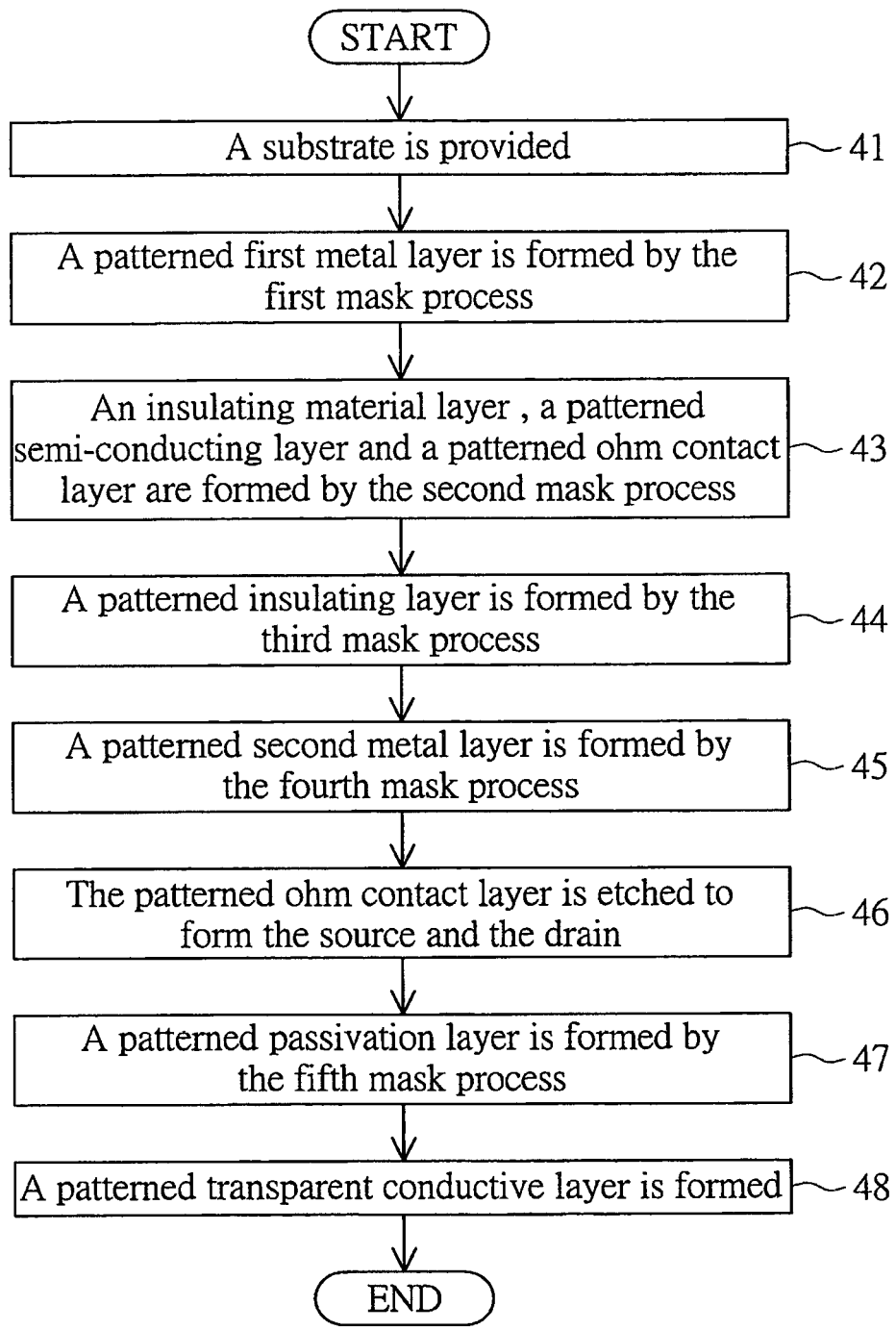
FIG. 17 is a flow chart of a method for manufacturing a pixel structure according to the fourth embodiment of the invention.
Figure 18A:
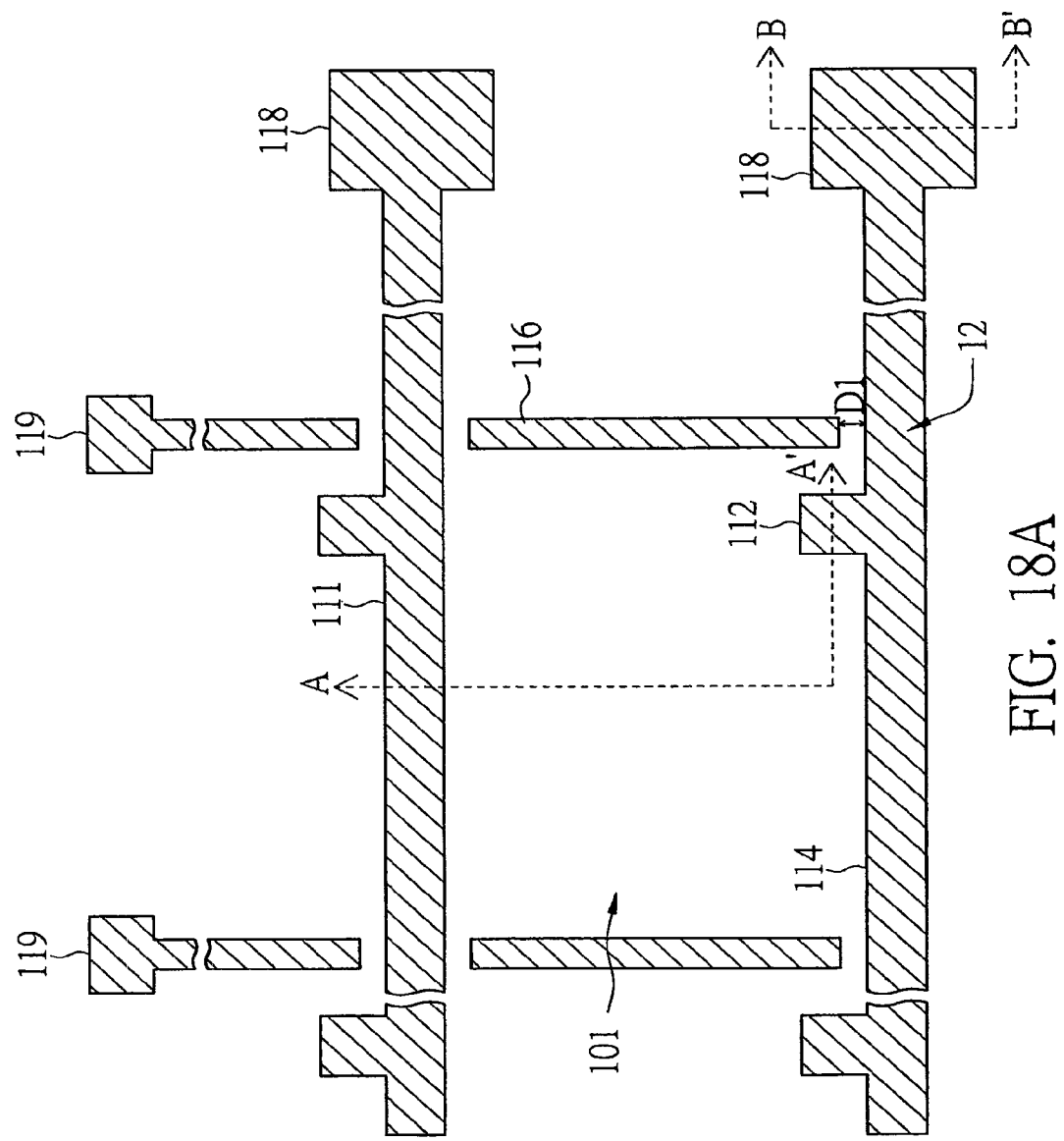
FIG. 18A illustrates the pixel structure of the fourth embodiment after the first mask process.
Figure 18B:
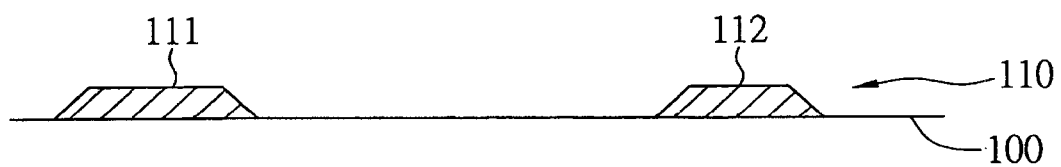
FIG. 18B is a cross-sectional view taken along line AA' in FIG. 18A.
Figure 18C:
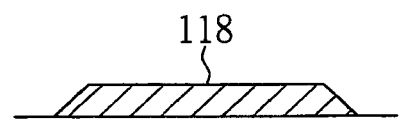
FIG. 18C is a cross-sectional view taken along line BB' in FIG. 18A.

Referring to FIG. 17, a flow chart of a method for manufacturing a pixel structure according to the fourth embodiment of the invention is illustrated. Referring to FIGS. 18A~18C at the same time, the pixel structure of the fourth embodiment after the first mask process and cross-sectional views taken along lines AA' and BB' in FIG. 18A are illustrated, respectively.

Please refer to FIG. 18A. First, as shown in the step 41, a substrate 100 is provided. Then, as shown in the step 42, a patterned first metal layer 110 is formed on the substrate 100 by the first mask process. The patterned first metal layer 110 includes a gate electrode 112, a first scan metal layer 114 and a first data metal segment 116. The first scan metal layer 114 and the first data metal segment 116 surround a display area 101 and the first scan metal layer 114 has an interlacing region 12, and the first data metal segment 116 and the interlacing region 12 are spaced at a first distance D1. In addition, as shown in FIG. 18B, the patterned first metal layer 110 further includes a patterned first metal layer 111 disposed on the substrate 100. As shown in FIG. 18C, the patterned first metal layer 110 further includes a scan pad 118 and a data pad 119 disposed on the substrate 100 and electrically connected to the first scan metal layer 114 and the first data metal segment 116, respectively. Basically, the steps 41, 42 and the steps 11, 12 of the first embodiment are the same, respectively.

Figure 19A:
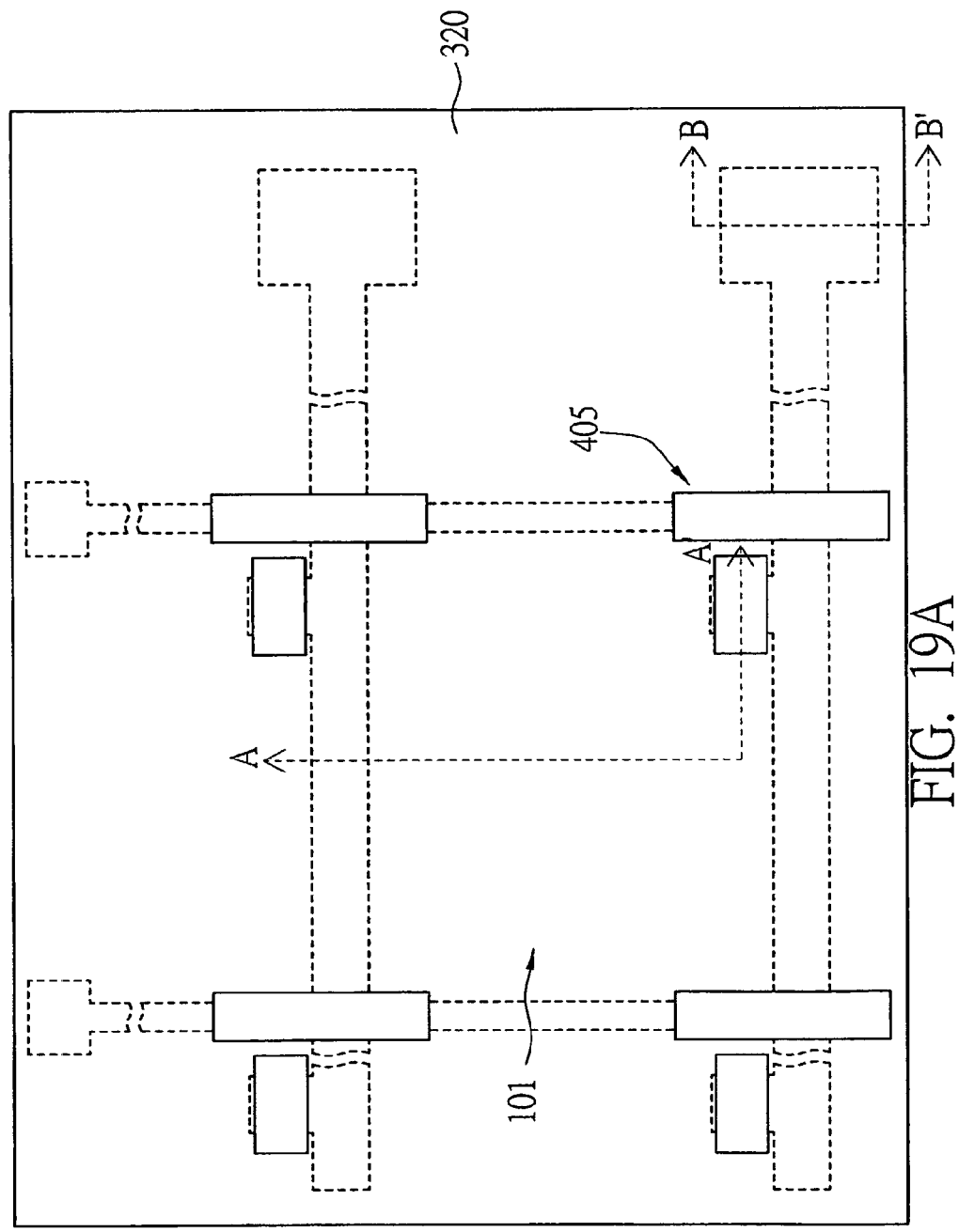
FIG. 19A illustrates the pixel structure of the fourth embodiment after the second mask process.
Figure 19B:
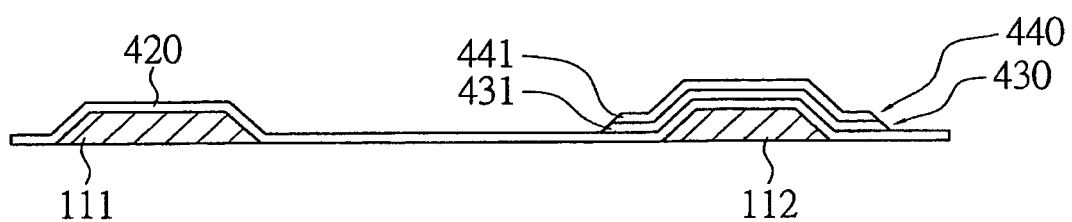
FIG. 19B is a cross-sectional view taken along line AA' in FIG. 19A.
Figure 19C:
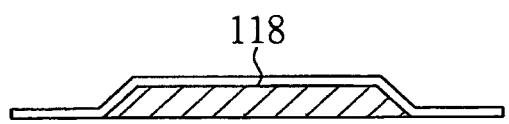
FIG. 19C is a cross-sectional view taken along line BB' in FIG. 19A.

Referring to FIGS. 19A~19C at the same time, the pixel structure of the fourth embodiment after the second mask process and cross-sectional views taken along lines AA' and BB' in FIG. 19A are illustrated, respectively. As shown in the step 43, an insulating material layer 420, a patterned semi-conducting layer 430 and a patterned ohm contact layer 440 are formed by the second mask process. The patterned semi-conducting layer 430 and the patterned ohm contact layer 440 are respectively positioned on a patterned semi-conducting layer 431 and a patterned ohm contact layer 441 above the gate electrode 112. The step 43 differs from the step 13 of the first embodiment in only defining the patterns of the patterned semi-conducting layer 430 and the patterned ohm contact layer 440. That is, only a semi-conducting material layer and an ohm contact material layer are etched.

Besides, as shown in FIG. 19A, a separating layer 405 disposed across the first scan metal layer 114 is formed.

Figure 20A:
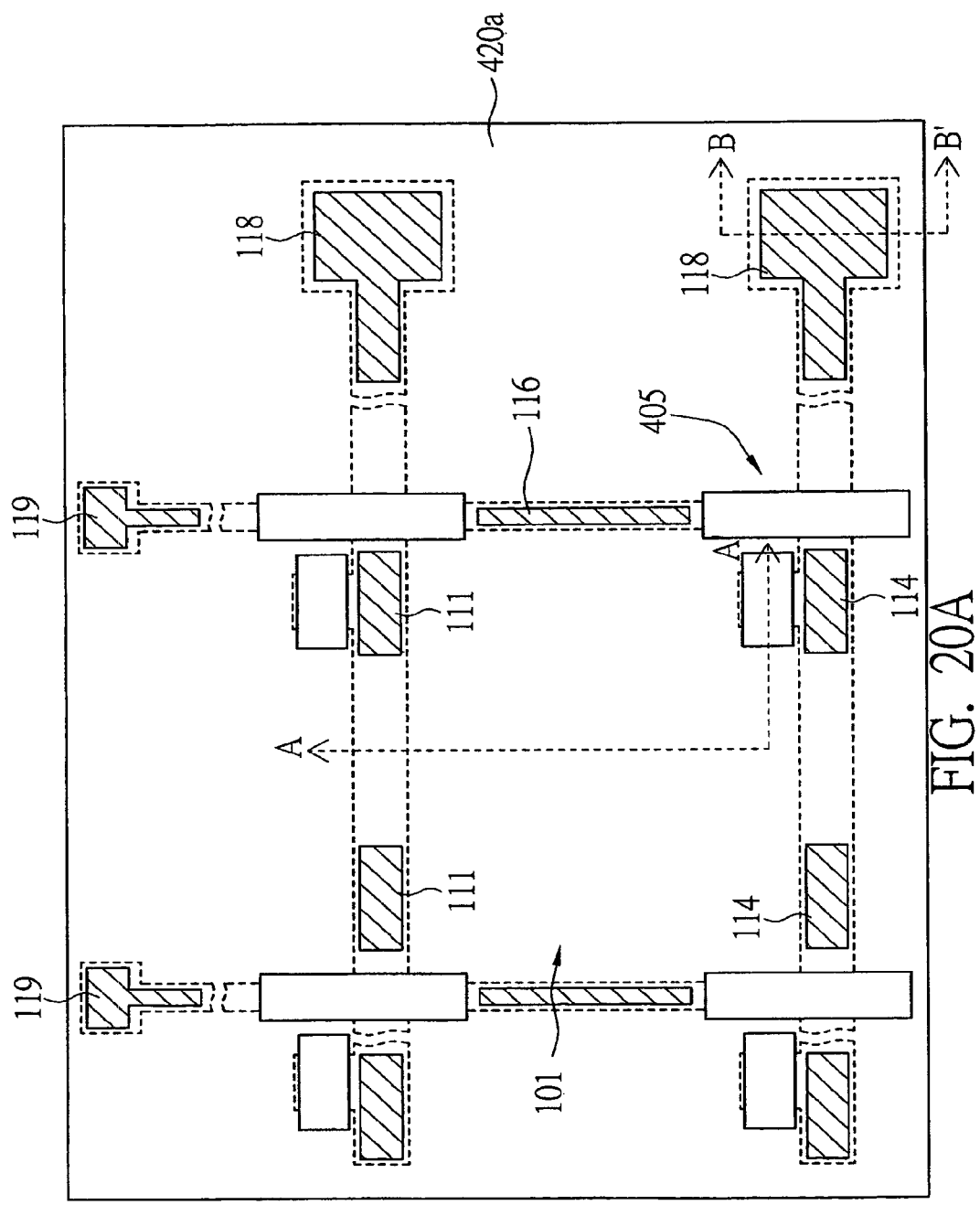
FIG. 20A illustrates the pixel structure of the fourth embodiment after the third mask process.
Figure 20B:
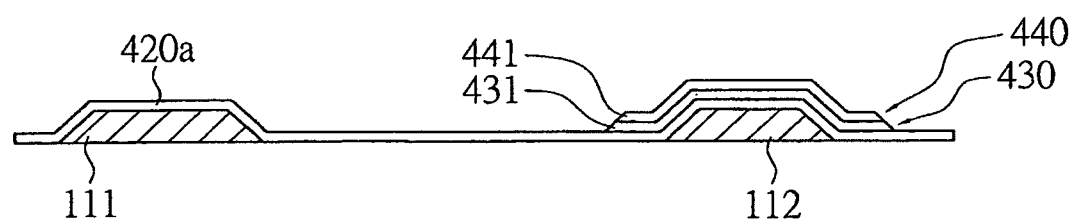
FIG. 20B is a cross-sectional view taken along I line AA' in FIG. 20A.
Figure 20C:
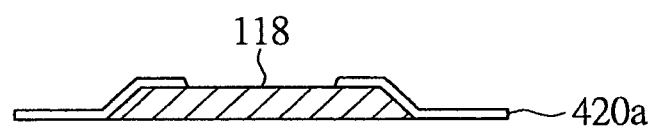
FIG. 20C is a cross-sectional view taken along line BB' in FIG. 20A.

Referring to FIGS. 20A~20C at the same time, the pixel structure of the fourth embodiment after the third mask process and cross-sectional views taken along lines AA' and BB' in FIG. 20A are illustrated, respectively. As shown in the step 44, the insulating material layer 420 is patterned by the third mask process to form a patterned insulating layer 420a. The patterned insulating layer 420a exposes the first scan metal layer 114, the first data metal segment 116, the patterned first metal layer 111, the scan pad 118 and the data pad 119.

Figure 21A:
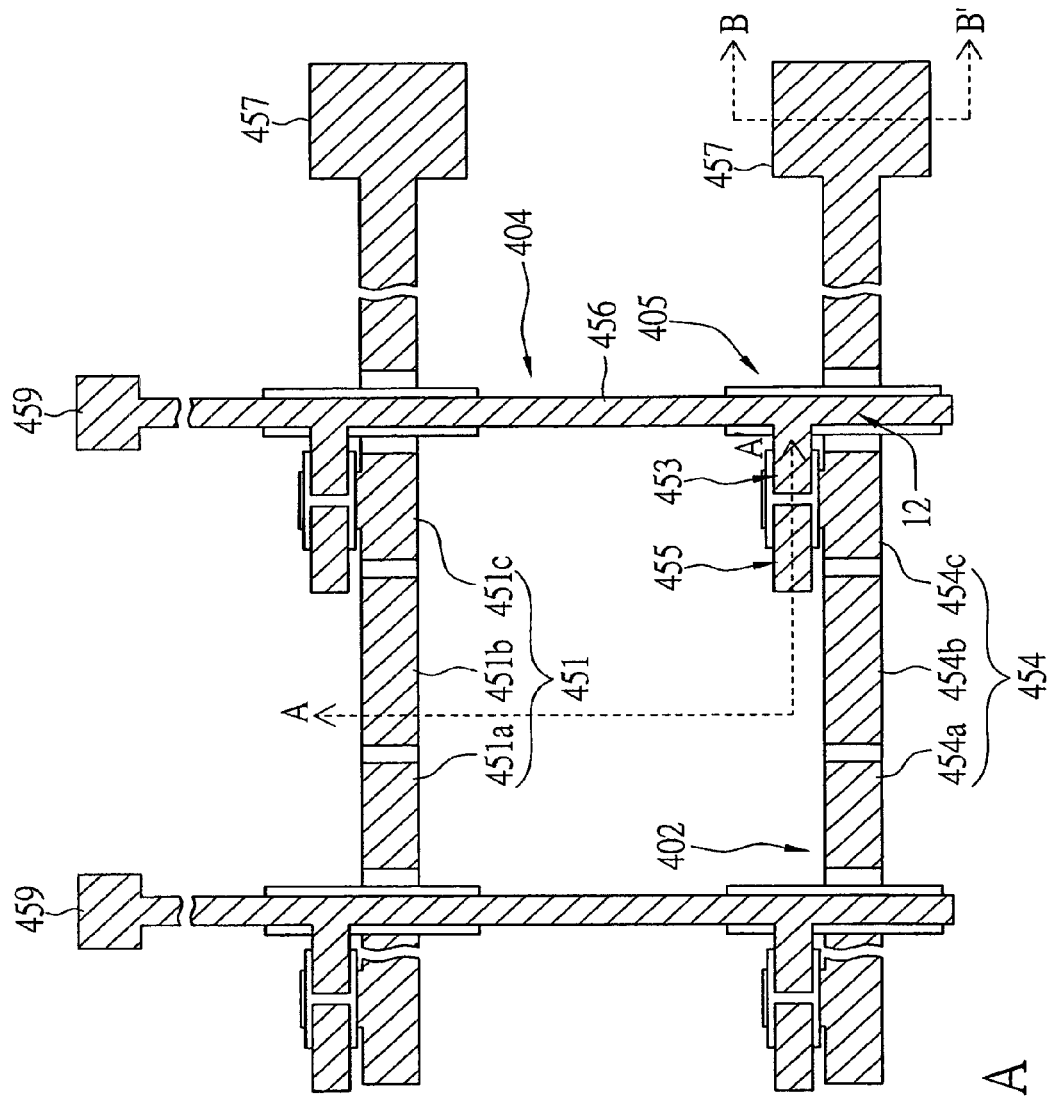
FIG. 21A illustrates the pixel structure of the fourth embodiment after the fourth mask process.
Figure 21B:
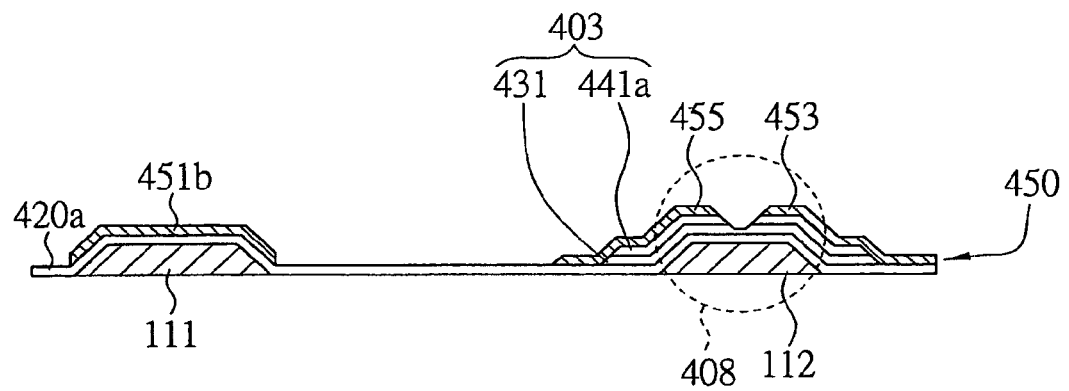
FIG. 21B is a cross-sectional view taken along line AA' in FIG. 21A.
Figure 21C:
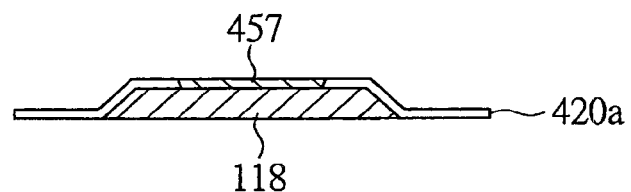
FIG. 21C is a cross-sectional view taken along line BB' in FIG. 21A.

Referring to FIGS. 21A~21C at the same time, the pixel structure of the fourth embodiment after the fourth mask process and cross-sectional views taken along lines AA' and BB' in FIG. 21A are illustrated, respectively. As shown in the step 45, a patterned second metal layer 450 is formed by the fourth mask process. The patterned second metal layer 450 includes a source 453, a drain 455, a second scan metal layer 454 and a second data metal layer 456. The first data metal segment 116 and the second scan metal layer 456 constitute a data line 404 electrically connected to the source 453. The first scan metal layer 114 and the second scan metal layer 454 constitute a scan line 402 electrically connected to the gate electrode 112. Furthermore, the scan line 402 and the data line 404 are interlaced with each other in the interlacing region 12. Patterned second metal layers 457, 459 are formed to respectively couple the scan pad 118 and the data pad 119 in the step 45 at the same time.

As shown in FIG. 21A, the second scan metal layer 454 includes several separate second scan metal segments 454a, 454b, 454c. The second scan metal segments 454a, 454c are coupled to the first scan metal layer 114 exposed by the patterned insulating layer 420a. The second scan metal segment 454b is formed on the patterned insulating layer 420a to electrically isolate from the first scan metal layer 114.

In addition, as shown in FIG. 21A, the scan line 404 further includes the separating layer 405 disposed across the scan line 402. The second data metal layer 456 is disposed on the separating layer 405 and across the interlacing region 12.

Besides, as shown in FIG. 21A, a patterned second metal layer 451 is formed in the step 45 at the same time. The patterned second metal layer 451 includes separate patterned second metal layers 451a, 451b, 451c. The patterned second metal layers 451a, 451c are coupled to the patterned first metal layer 111 exposed by the patterned insulating layer 420a. The patterned second metal layer 451b is formed on the patterned insulating layer 420a to electrically isolate from the patterned first metal layer 111.

Then, as shown in the step 46, the patterned ohm contact layer 441 is etched to form an ohm contact layer 441a. The source 453 and the drain 455 are formed on the patterned semi-conducting layer 431 and the ohm contact layer 441a and constitute an active element 408, such as a thin film transistor, with the gate electrode 112. The patterned semi-conducting layer 431 and the ohm contact layer 441a constitute a channel layer 403.

Figure 22A:
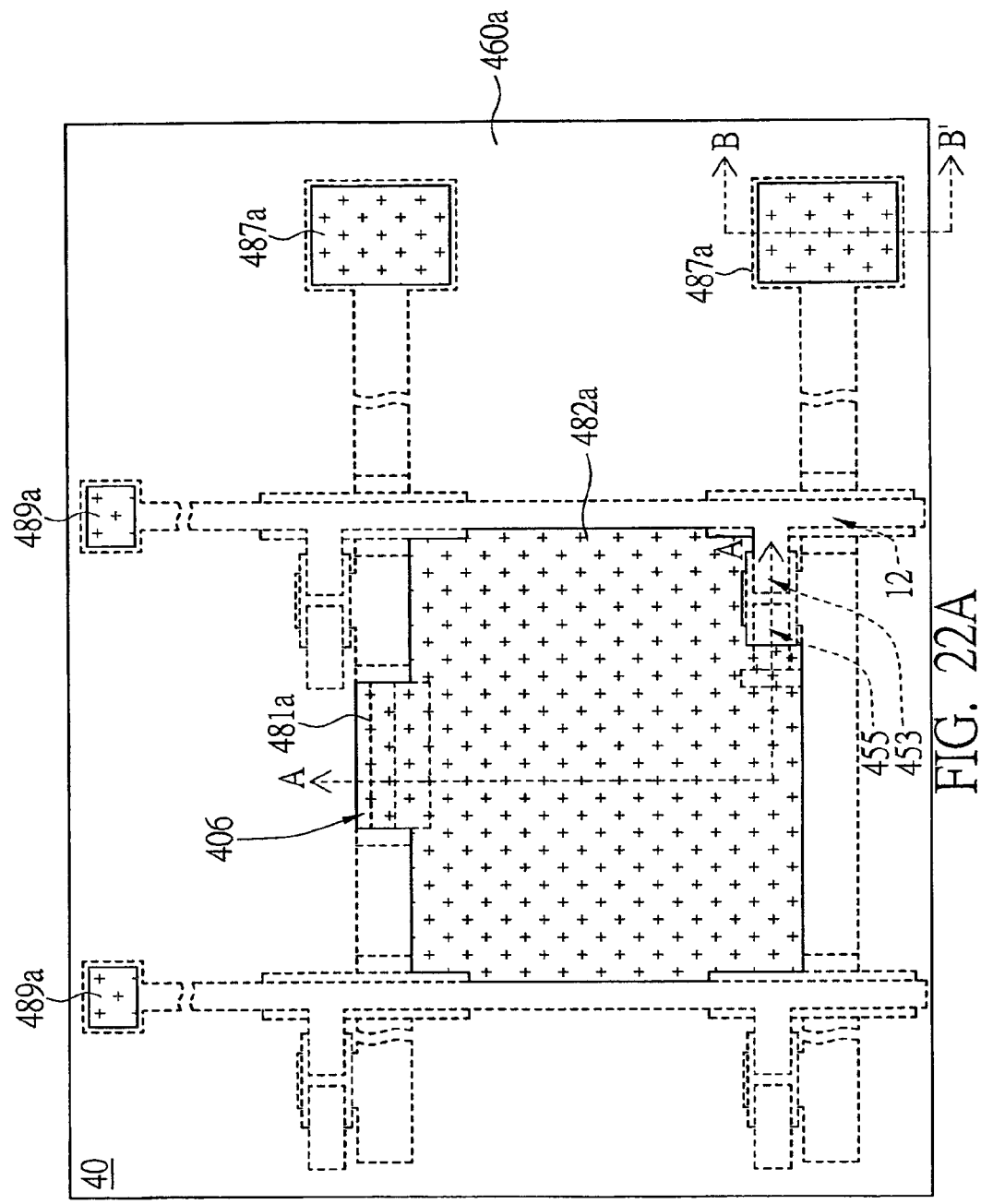
FIG. 22A illustrates the pixel structure of the fourth embodiment after the fifth mask process.
Figure 22B:
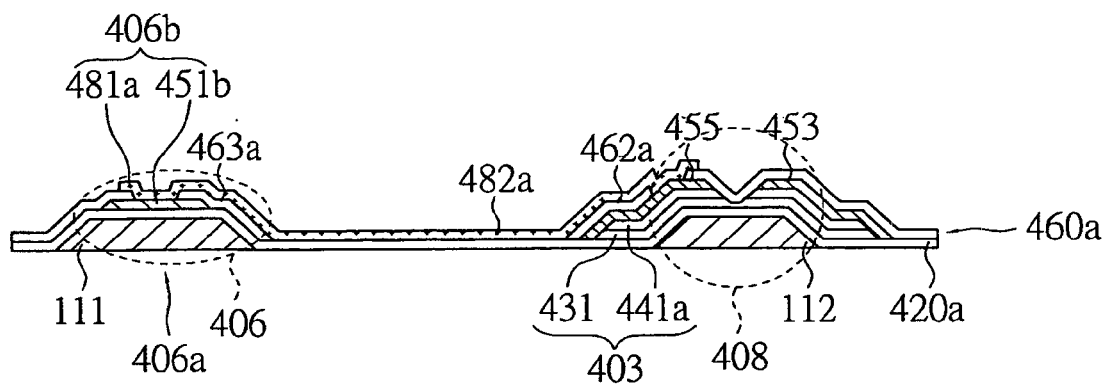
FIG. 22B is a cross-sectional view taken along line AA' in FIG. 22A.
Figure 22C:
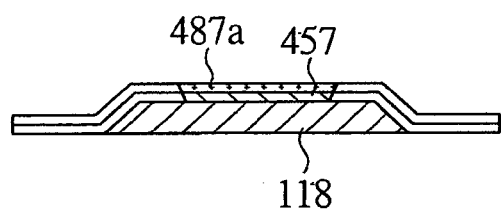
FIG. 22C is a cross-sectional view taken along line BB' in FIG. 22A.

Referring to FIGS. 22A~22C at the same time, the pixel structure of the fourth embodiment after the fifth mask process and cross-sectional views taken along lines AA' and BB' in FIG. 22A are illustrated, respectively. As shown in the step 47, a patterned passivation layer 460a is formed by the fifth mask process. The patterned passivation layer 460a partially covers a part edge of the drain 455.

After that, as shown in the step 48, a patterned transparent conductive layer 480a is formed. The patterned transparent conductive layer 480a includes a pixel electrode 482a. The pixel electrode 482a is disposed across a patterned passivation layer 462a on the part edge of the drain 455 and electrically connected to the drain 455. In addition, patterned transparent conductive layers 487a, 489a of the patterned transparent conductive layer 480a are coupled to the patterned second metal layers 457, 459, respectively.

Figure 22D:
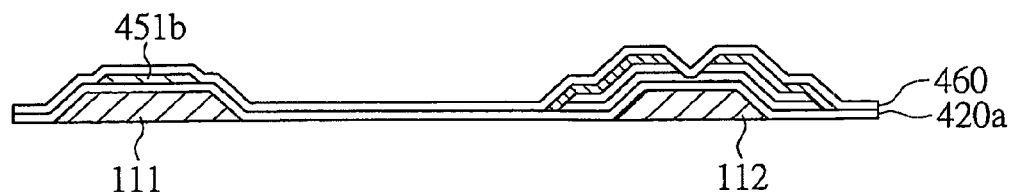
FIGS. 22D~22I illustrate the detail steps of the fifth mask process of the fourth embodiment.

The steps 47~48 are elaborated in FIGS. 22D~22I. Referring to FIGS. 22D~22I, the detail steps of the fifth mask process of the fourth embodiment are illustrated. As shown in FIG. 22D, a passivation material layer 460 is firstly formed.

Figure 22E:
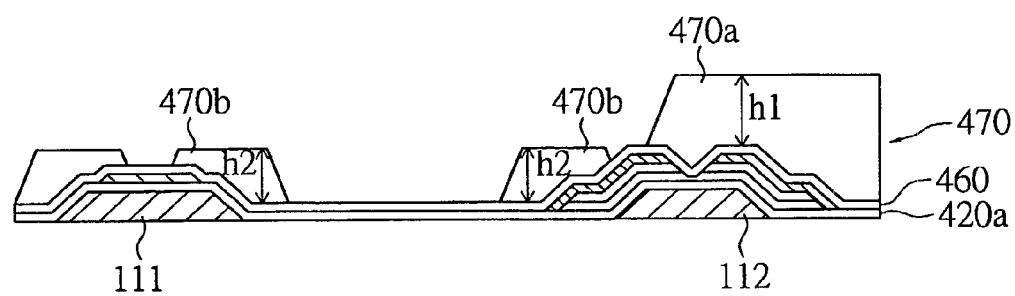

Then, as shown in FIG. 22E, a patterned photoresist layer 470 is formed on the passivation material layer 460. The patterned photoresist layer 470 includes a patterned photoresist layer 470a with the thickness h1 and a patterned photoresist layer 470b with the thickness h2. The thickness h1 is greater than the thickness h2.

Figure 22F:
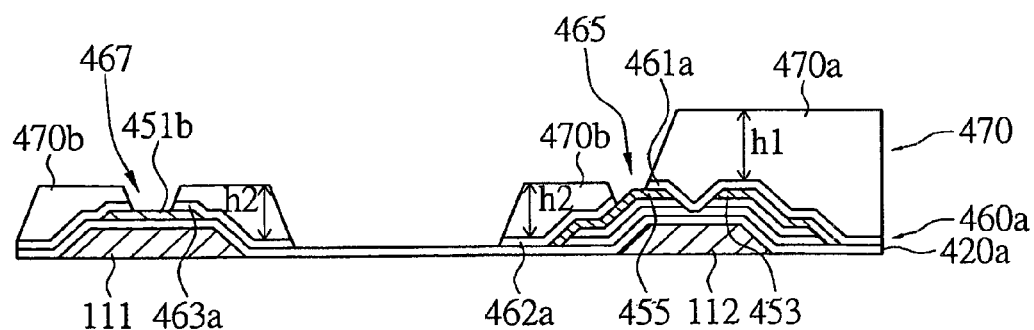

After that, as shown in FIG. 22F, the passivation material layer 460 is etched to form the patterned passivation layer 460a. The patterned passivation layer 460a includes a first passivation layer 461a, a second passivation layer 462a and a third passivation layer 463a. The first passivation layer 461a and the second passivation layer 462a form a contact hole 465 to expose the drain 455, and the second passivation layer 462a covers the part edge of the drain 455. The third passivation layer 463a forms a contact hole 467 to expose the patterned second metal layer 451b. However, the invention is not limited thereto. The third passivation layer 463a can only cover a part edge of the patterned second metal layer 451b.

Figure 22G:
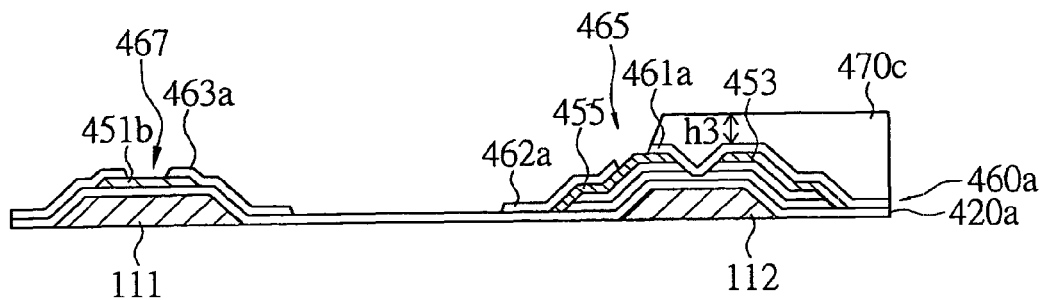

Then, as shown in FIG. 22G, the patterned photoresist layer 470 is ashed to expose the second passivation layer 462a and the third passivation layer 463a. After the patterned photoresist layer 470 is ashed, the patterned photoresist layer 470b is removed. The original patterned photoresist layer 470a becomes a patterned photoresist layer 470c with the thickness h3.

Figure 22H:
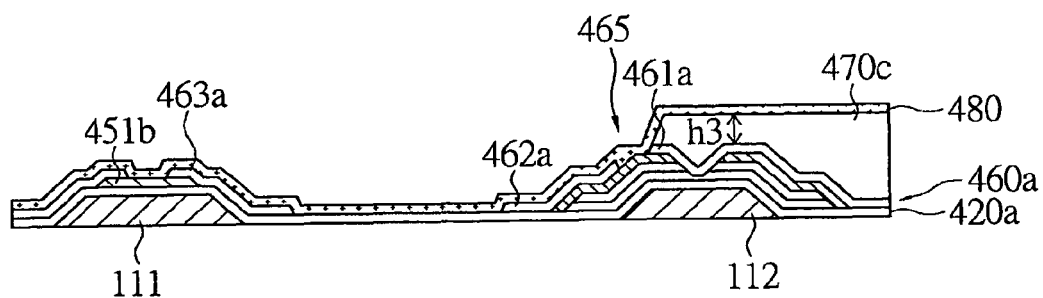

After that, as shown in FIG. 22H, a transparent conductive layer 480 is formed. The transparent conductive layer 480 is coupled to the drain 455 and the patterned second metal layer 451b via the contact hole 465.

Figure 22I:
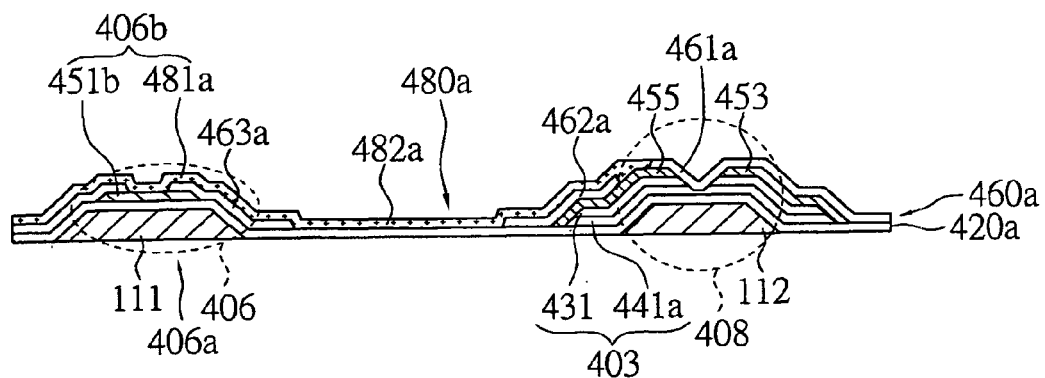

Then, as shown in FIG. 22I, the remaining patterned photoresist layer 470c is removed and part of the transparent conductive layer 480 on the remaining patterned photoresist layer 470c is also removed concurrently so as to form the patterned transparent conductive layer 480a. The patterned transparent conductive layer 480a includes the pixel electrode 482a and a patterned transparent conductive layer 481a coupled to the patterned second metal layer 451b. Heretofore, the pixel structure 40 is completed. The step of removing the remaining patterned photoresist layer 470c includes the lift-off process. Preferably, the patterned photoresist layer 470c is removed by using chemicals or performing the laser lift-off process.

As shown in FIG. 22A and FIG. 22B, the pixel structure 40 includes the active element 408, the first passivation layer 461a, the second passivation layer 462a, the storage capacitor 406, the data line 402 and the pixel electrode 482. The active element 408 is closely adjacent to the interlacing region 12 and electrically connected to the scan line 402 and the data line 404. The active element 408 includes the gate electrode 112, the patterned insulating layer 420a, the channel layer 403, the source 453 and the drain 455. The gate electrode 112 and the scan line 402 are electrically connected to each other. The patterned insulating layer 420a is positioned on the gate electrode 112. The channel layer 403 is positioned on the patterned insulating layer 420a above the gate electrode 112. The source 453 and the drain 455 are positioned on the channel layer 403, and the source 453 is coupled to the data line 404. The channel layer 403 includes the ohm contact layer 441a and the patterned semi-conducting layer 431. The ohm contact layer 441a is disposed on the patterned semi-conducting layer 431.

As shown in FIG. 22B, the first passivation layer 461a and the second passivation layer 462a cover the active element 408 and form the contact hole 465 to expose the part of the drain 455. The second passivation layer 462a covers the part edge of the drain 455.

As shown in FIG. 22B, the storage capacitor 406 has a first capacitance metal layer 406a and a second capacitance metal layer 406b. The second capacitance metal layer 406b is disposed on the first capacitance metal layer 406a. The first capacitance metal layer 406a includes the first patterned metal layer 111, and the second capacitance metal layer 406b includes the second patterned metal layer 451b and the patterned transparent conductive layer 481a. A capacitance insulating layer includes a part of the patterned insulating layer 420a disposed between the first capacitance metal layer 406a and the second capacitance metal layer 406b. Therefore, in the embodiment, the storage capacitor 406 composed of a metal layer, an insulator and a metal layer is called MIM capacitance structure.

According to the pixel structure and the method for manufacturing the same disclosed in the above embodiments of the invention, the manufacturing cost of the pixel structure is greatly decreased by using only four masks or five masks. Besides, the scan line and data line of the pixel structure of each embodiment are double-metal structures, so that the transmission resistance values of the signal lines (the scan line and the data line) are remarkably reduced to avoid the signals decaying and delaying. In addition, the passivation layer of the pixel structure is formed on the edge of the drain in each embodiment, and the transparent conductive layer is disposed across the passivation layer to contact the drain. Therefore, the drain and the pixel electrode have good electrical conduction, and the situation for the pixel electrode to break during the formation can be avoided.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for manufacturing a pixel structure, comprising:
    providing a substrate;
    forming a patterned first metal layer on the substrate, wherein the patterned first metal layer comprises a gate electrode, a first scan metal layer and a first data metal segment;
    forming a patterned insulating layer on the patterned first metal layer;
    forming a patterned semi-conducting layer on the patterned insulating layer;
    forming a patterned second metal layer comprising a source, a drain, a second scan metal layer and a second data metal layer, wherein the source and the drain are formed on the patterned semi-conducting layer and constitute an active element with the gate electrode, the first data metal segment and the second data metal layer constitute a data line electrically connected to the source, and the first scan metal layer and the second scan metal layer constitute a scan line electrically connected to the gate electrode;
    forming a patterned passivation layer partially covering a part edge of the drain; and
    forming a patterned transparent conductive layer comprising a pixel electrode, wherein the pixel electrode is disposed across the patterned passivation layer on the part edge of the drain and electrically connected to the drain,
    wherein the steps of forming the patterned passivation layer and forming the patterned transparent conductive layer comprise:
    forming a passivation material layer;
    forming a patterned photoresist layer on the passivation material layer;
    etching the passivation material layer to form the patterned passivation layer and a first contact hole exposing a region of the drain, wherein the patterned passivation layer comprises a first passivation layer and a second passivation layer, the first contact hole is formed between the first passivation layer and the second passivation layer, the first passivation layer and the second passivation layer cover sidewalls of the drain, and the region of the drain exposed by the first contact hole is not connected with the sidewalls of the drain;
    ashing the patterned photoresist layer to expose the second passivation layer and to form a remaining patterned photoresist layer which is on the first passivation layer;
    forming a transparent conductive layer on the remaining patterned photoresist layer to electrically connect to the drain via the first contact hole; and
    removing the remaining patterned photoresist layer together with the transparent conductive layer on the remaining patterned photoresist layer to form the patterned transparent conductive layer electrically connected to the drain.

2. The method as claim 1, wherein the step of removing the remaining patterned photoresist layer and the transparent conductive layer on the remaining patterned photoresist layer comprises a lift-off process.

3. The method as claim 1, wherein the patterned passivation layer further comprises a third passivation layer, and the second passivation layer and the third passivation layer form an opening to expose the substrate or the patterned insulating layer.

4. The method as claim 3, wherein the transparent conductive layer covers the remaining patterned photoresist layer, the drain, the second passivation layer and the third passivation layer.

5. The method as claim 3, wherein the patterned transparent conductive layer exposes the first passivation layer and covers the drain, the second passivation layer and the third passivation layer.

6. The method as claim 1, wherein the patterned transparent conductive layer exposes the first passivation layer and covers the drain and the second passivation layer.

7. The method as claim 1, wherein a side edge of the first passivation layer contacts with a side edge of the patterned transparent conductive layer.

8. The method as claim 1, wherein the patterned photoresist layer comprises a first patterned photoresist layer with a first thickness and a second patterned photoresist layer with a second thickness smaller than the first thickness, and after the step of ashing the patterned photoresist layer, the second patterned photoresist layer is removed to expose the second passivation layer and the first patterned photoresist layer is remained to cover the first passivation layer.

9. A method for manufacturing a pixel structure, comprising:
    providing a substrate;

forming a patterned first metal layer on the substrate, wherein the patterned first metal layer comprises a gate electrode, a first scan metal layer and a first data metal segment;

forming a patterned insulating layer on the patterned first metal layer;

forming a patterned semi-conducting layer on the patterned insulating layer;

forming a patterned second metal layer comprising a source, a drain, a second scan metal layer and a second data metal layer, wherein the source and the drain are formed on the patterned semi-conducting layer and constitute an active element with the gate electrode, the first data metal segment and the second data metal layer constitute a data line electrically connected to the source, and the first scan metal layer and the second scan metal layer constitute a scan line electrically connected to the gate electrode;

forming a patterned passivation layer having a first contact hole exposing a region of the drain, wherein the patterned passivation layer covers sidewalls of the drain, and the region of the drain exposed by the first contact hole is not connected with the sidewalls of the drain;

forming a patterned transparent conductive layer comprising a pixel electrode, wherein the pixel electrode is disposed across the patterned passivation layer on the part edge of the drain and electrically connected to the drain; and forming a storage capacitor on the substrate, wherein the storage capacitor comprises a first capacitance electrode, a second capacitance metal layer and a capacitance insulating layer disposed between the first capacitance metal layer and the second capacitance metal layer, wherein the capacitance insulating layer comprises the patterned passivation layer.

10. The method as claim 9, wherein a portion of the patterned passivation layer serves as the capacitance insulating layer.

11. The method as claim 9, wherein the first capacitance metal layer comprises the patterned first metal layer and the patterned second metal layer, and the second capacitance metal layer comprises the patterned transparent conductive layer.

12. The method as claim 11, wherein a portion of the patterned first metal layer and a portion of the patterned second metal layer commonly serve as the first capacitance metal layer, and a portion of the patterned transparent conductive layer serves as the second capacitance metal layer.

13. The method as claim 12, wherein the portion of the patterned second metal layer is stacked on and in contact with the portion of the patterned first metal layer.

14. The method as claim 9, wherein the steps of forming the patterned passivation layer and forming the patterned transparent conductive layer comprise:

forming a passivation material layer;

forming a patterned photoresist layer on the passivation material layer;

etching the passivation material layer to form the patterned passivation layer, wherein the patterned passivation layer comprises a first passivation layer and a second passivation layer, the first passivation layer and the second passivation layer form the first contact hole to expose the drain, and the second passivation layer covers the part edge of the drain;

ashing the patterned photoresist layer to expose the second passivation layer and to form the remaining patterned photoresist layer which is on the first passivation layer;

forming a transparent conductive layer on the remaining patterned photoresist layer to electrically connect to the drain via the first contact hole; and removing the remaining patterned photoresist layer together with the transparent conductive layer on the remaining patterned photoresist layer to simultaneously form the second capacitance metal layer and the patterned transparent conductive layer electrically connected to the drain.

15. The method as claim 14, wherein the step of removing the remaining patterned photoresist layer and the transparent conductive layer on the remaining patterned photoresist layer comprises a lift-off process.

16. The method as claim 14, wherein the patterned passivation layer further comprises a third passivation layer, the second passivation layer and the third passivation layer form an opening to expose the substrate or the patterned insulating layer, and third passivation layer serves as the capacitance insulating layer.

17. The method as claim 16, wherein the transparent conductive layer covers the remaining patterned photoresist layer, the drain, the second passivation layer and the third passivation layer.

18. The method as claim 16, wherein the patterned transparent conductive layer exposes the first passivation layer and covers the drain, the second passivation layer and the third passivation layer.

19. A method for manufacturing a pixel structure, comprising:

providing a substrate;

forming a patterned first metal layer on the substrate, wherein the patterned first metal layer comprises a gate electrode, a first scan metal layer and a first data metal segment;

forming a patterned insulating layer on the patterned first metal layer;

forming a patterned semi-conducting layer on the patterned insulating layer;

forming a patterned second metal layer comprising a source, a drain, a second scan metal layer and a second data metal layer, wherein the source and the drain are formed on the patterned semi-conducting layer and constitute an active element with the gate electrode, the first data metal segment and the second data metal layer constitute a data line electrically connected to the source, and the first scan metal layer and the second scan metal layer constitute a scan line electrically connected to the gate electrode, wherein the second scan metal layer is stacked on the first scan metal layer and directly contacts with the first scan metal layer;

forming a patterned passivation layer partially covering a part edge of the drain; and forming a patterned transparent conductive layer comprising a pixel electrode, wherein the pixel electrode is disposed across the patterned passivation layer on the part edge of the drain and electrically connected to the drain, wherein the steps of forming the patterned passivation layer and forming the patterned transparent conductive layer comprise:

forming a passivation material layer;

forming a patterned photoresist layer on the passivation material layer;

etching the passivation material layer to form the patterned passivation layer, wherein the patterned passivation layer comprises a first passivation layer and a second passivation layer, the first passivation layer and the second passivation layer form a first contact hole to expose the drain, and the second passivation layer covers the part edge of the drain;

ashing the patterned photoresist layer to expose the second passivation layer and to form a remaining patterned photoresist layer which is on the first passivation layer;

forming a transparent conductive layer on the remaining patterned photoresist layer to electrically connect to the drain via the first contact hole; and removing the remaining patterned photoresist layer together with the transparent conductive layer on the remaining patterned photoresist layer to form the patterned transparent conductive layer electrically connected to the drain.

20. The method as claim 19, wherein the step of removing the remaining patterned photoresist layer and the transparent conductive layer on the remaining patterned photoresist layer comprises a lift-off process.

21. The method as claim 19, wherein the patterned passivation layer further comprises a third passivation layer, and the second passivation layer and the third passivation layer form an opening to expose the substrate or the patterned insulating layer, and the transparent conductive layer covers the remaining patterned photoresist layer, the drain, the second passivation layer and the third passivation layer.

22. The method as claim 19, wherein the patterned passivation layer further comprises a third passivation layer, and the second passivation layer and the third passivation layer form an opening to expose the substrate or the patterned insulating layer, and the patterned transparent conductive layer exposes the first passivation layer and covers the drain, the second passivation layer and the third passivation layer.

23. The method as claim 19, wherein the patterned transparent conductive layer exposes the first passivation layer and covers the drain and the second passivation layer.

24. The method as claim 19, wherein a side edge of the first passivation layer contacts with a side edge of the patterned transparent conductive layer.

25. The method as claim 19, wherein the patterned photoresist layer comprises a first patterned photoresist layer with a first thickness and a second patterned photoresist layer with a second thickness smaller than the first thickness, and after the step of ashing the patterned photoresist layer, the second patterned photoresist layer is removed to expose the second passivation layer and the first patterned photoresist layer is remained to cover the first passivation layer.

26. A method for manufacturing a pixel structure, comprising:

providing a substrate;

forming a patterned first metal layer on the substrate, wherein the patterned first metal layer comprises a gate electrode, a first scan metal layer and a first data metal segment;

forming a patterned insulating layer on the patterned first metal layer;

forming a patterned semi-conducting layer on the patterned insulating layer;

forming a patterned second metal layer comprising a source, a drain, a second scan metal layer and a second data metal layer, wherein the source and the drain are formed on the patterned semi-conducting layer and constitute an active element with the gate electrode, the first data metal segment and the second data metal layer constitute a data line electrically connected to the source, and the first scan metal layer and the second scan metal layer constitute a scan line electrically connected to the gate electrode, wherein the second scan metal layer is stacked on the first scan metal layer and directly contacts with the first scan metal layer;

forming a patterned passivation layer partially covering a part edge of the drain;

forming a patterned transparent conductive layer comprising a pixel electrode, wherein the pixel electrode is disposed across the patterned passivation layer on the part edge of the drain and electrically connected to the drain; and forming a storage capacitor on the substrate, wherein the storage capacitor comprises a first capacitance electrode, a second capacitance metal layer and a capacitance insulating layer disposed between the first capacitance metal layer and the second capacitance metal layer, wherein the capacitance insulating layer comprises the patterned passivation layer.

27. The method as claim 26, wherein a portion of the patterned passivation layer serves as the capacitance insulating layer.

28. The method as claim 26, wherein the first capacitance metal layer comprises the patterned first metal layer and the patterned second metal layer, and the second capacitance metal layer comprises the patterned transparent conductive layer, a portion of the patterned first metal layer and a portion of the patterned second metal layer commonly serve as the first capacitance metal layer, and a portion of the patterned transparent conductive layer serves as the second capacitance metal layer, and the portion of the patterned second metal layer is stacked on and in contact with the portion of the patterned first metal layer.

29. The method as claim 26, wherein the steps of forming the patterned passivation layer and forming the patterned transparent conductive layer comprise:

forming a passivation material layer;

forming a patterned photoresist layer on the passivation material layer;

etching the passivation material layer to form the patterned passivation layer, wherein the patterned passivation layer comprises a first passivation layer and a second passivation layer, the first passivation layer and the second passivation layer form the first contact hole to expose the drain, and the second passivation layer covers the part edge of the drain;

ashing the patterned photoresist layer to expose the second passivation layer and to form the remaining patterned photoresist layer which is on the first passivation layer;

forming a transparent conductive layer on the remaining patterned photoresist layer to electrically connect to the drain via the first contact hole; and removing the remaining patterned photoresist layer together with the transparent conductive layer on the remaining patterned photoresist layer to simultaneously form the second capacitance metal layer and the patterned transparent conductive layer electrically connected to the drain.

30. The method as claim 29, wherein the step of removing the remaining patterned photoresist layer and the transparent conductive layer on the remaining patterned photoresist layer comprises a lift-off process.

31. The method as claim 29, wherein the patterned passivation layer further comprises a third passivation layer, the second passivation layer and the third passivation layer form an opening to expose the substrate or the patterned insulating layer, and third passivation layer serves as the capacitance insulating layer.

32. The method as claim 31, wherein the transparent conductive layer covers the remaining patterned photoresist layer, the drain, the second passivation layer and the third passivation layer.

33. The method as claim 31, wherein the patterned transparent conductive layer exposes the first passivation layer and covers the drain, the second passivation layer and the third passivation layer.

* * * * *